(12) United States Patent
Mun

(10) Patent No.: US 12,720,769 B2
(45) Date of Patent: Aug. 25, 2026

(54) SEMICONDUCTOR PACKAGE

(71) Applicant: Samsung Electronics Co., Ltd., Suwon-si (KR)

(72) Inventor: Kyungdon Mun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 782 days.

(21) Appl. No.: 18/163,378

(22) Filed: Feb. 2, 2023

(65) Prior Publication Data

US 2024/0032310 A1 Jan. 25, 2024

(30) Foreign Application Priority Data

Jul. 25, 2022 (KR) ........................ 10-2022-0092063

(51) Int. Cl.
*H10B 80/00* (2026.01)
*H10W 70/60* (2026.01)
(Continued)

(52) U.S. Cl.
CPC .......... *H10B 80/00* (2023.02); *H10W 70/611* (2026.01); *H10W 90/401* (2026.01);
(Continued)

(58) Field of Classification Search
CPC ..... H10B 80/00; H01L 23/5385; H01L 24/05; H01L 24/06; H01L 24/08; H01L 24/16; H01L 24/17; H01L 24/32; H01L 24/33; H01L 24/73; H01L 2224/0557; H01L 2224/06181; H01L 2224/08145; H01L 2224/08225; H01L 2224/16227;
(Continued)

(56) References Cited

U.S. PATENT DOCUMENTS 10,573,368 B2 2/2020 Biswas et al.
10,803,548 B2 10/2020 Matam et al.
(Continued)

FOREIGN PATENT DOCUMENTS

KR 10-2020-0071920 A 6/2020
KR 10-2022-0103003 A 7/2022

OTHER PUBLICATIONS

Office Action in Korean Appln. No. 10-2022-0092063, mailed on Jan. 21, 2026, 19 pages (with English translation).

*Primary Examiner* — Ratisha Mehta
*Assistant Examiner* — Thaddeus J Kolb
(74) *Attorney, Agent, or Firm* — Fish & Richardson P.C.

(57) ABSTRACT

A semiconductor package may include a base wiring structure, a first bridge chip and a cache memory chip on the base wiring structure and spaced apart from each other in a horizontal direction, and logic semiconductor chips adjacent to each other on the first bridge chip and the cache memory chip. Logic semiconductor chips each may include a cache memory. The first bridge chip may overlap at least two of the logic semiconductor chips in a vertical direction and the first bridge chip may include first bridge wirings electrically connecting at least two of the logic semiconductor chips. The cache memory chip may overlap the cache memory of at least one of the logic semiconductor chips in the vertical direction and the cache memory chip may be electrically connected to the cache memory of at least one of the logic semiconductor chips.

20 Claims, 26 Drawing Sheets

(51) Int. Cl.

| | |
|---|---|
| ***H10W 72/00*** | (2026.01) |
| ***H10W 72/20*** | (2026.01) |
| ***H10W 72/30*** | (2026.01) |
| ***H10W 72/90*** | (2026.01) |
| ***H10W 74/15*** | (2026.01) |
| ***H10W 90/00*** | (2026.01) |

(52) U.S. Cl.

CPC ................. *H10W 72/07254* (2026.01); *H10W 72/07354* (2026.01); *H10W 72/247* (2026.01); *H10W 72/347* (2026.01); *H10W 72/877* (2026.01); *H10W 72/942* (2026.01); *H10W 72/944* (2026.01); *H10W 74/15* (2026.01); *H10W 90/724* (2026.01); *H10W 90/734* (2026.01); *H10W 90/792* (2026.01); *H10W 90/794* (2026.01)

(58) Field of Classification Search

CPC . H01L 2224/17181; H01L 2224/32225; H01L 2224/33181; H01L 2224/73204; H01L 2224/73253; H01L 2924/1431; H01L 2924/1432; H01L 2924/14361; H01L 2924/1437; H01L 2924/1441; H01L 2924/1443; H01L 2924/14511; H01L 23/5386; H01L 24/13; H01L 23/49816; H01L 23/5383; H01L 23/5384; H01L 23/5389; H01L 24/19; H01L 24/20; H01L 25/0652; H01L 23/3185; H01L 24/07; H01L 25/0655; H01L 25/0657; H01L 25/18; H01L 2224/02331; H01L 2225/06548

See application file for complete search history.

(56) References Cited

U.S. PATENT DOCUMENTS

| | | | | |
|---|---|---|---|---|
| 11,043,472 | B1 | 6/2021 | Dokania et al. | |
| 11,094,633 | B2 | 8/2021 | Qian et al. | |
| 11,139,270 | B2 | 10/2021 | Manipatruni et al. | |
| 2015/0255142 | A1* | 9/2015 | Dabral | G11C 11/4074 438/381 |
| 2020/0161125 | A1* | 5/2020 | Huang | H10P 70/20 |
| 2020/0286809 | A1* | 9/2020 | Gong | H10W 40/25 |
| 2020/0303363 | A1* | 9/2020 | Yoo | H10W 90/00 |
| 2021/0050300 | A1* | 2/2021 | Lin | H10W 70/614 |
| 2021/0098421 | A1* | 4/2021 | Wu | H10W 74/473 |
| 2022/0336393 | A1* | 10/2022 | Chen | H10W 74/016 |
| 2023/0154825 | A1* | 5/2023 | Tong | H10W 40/254 257/659 |
| 2023/0334613 | A1* | 10/2023 | Daxer | G06T 1/20 |
| 2023/0363182 | A1* | 11/2023 | Lin | H03K 19/1776 |
| 2025/0266363 | A1* | 8/2025 | Yu | H10P 72/74 |

* cited by examiner

1000
CCR
100
715
700
600
815
800
200
300

1000a
CCR
100
715
700
600a
815
800
200
300

1000d
CCRd
CCR1
CCR2
100
700
715
604
600d
602
815
800
200
300

1008
272
222
460
450
400
330P2
332
334
330
330P1
214 212
310
CCR 110 160
112
114
500
120
100
710
715
720
700
612
620
610
600
294
292
254
810
815
820
262
264
800
200a
260
(260H)
280
270
244
230
220
242
300
210
260

272
222
350
450
400
330P2
332
334
330
330P1
310
110
CCR
112
114
120
150
100
710
715
720
700
380
382
384
612
620
610
600
360
810
815
820
205
800
294
292
252
254
250
200
260
(260H)
280
270
244
230
220
242
210
300

SEMICONDUCTOR PACKAGE

CROSS-REFERENCE TO RELATED APPLICATION

This application is based on and claims priority under 35 U.S.C. § 119 to Korean Patent Application No. 10-2022-0092063, filed on Jul. 25, 2022 in the Korean Intellectual Property Office, the disclosure of which is incorporated by reference herein in its entirety.

BACKGROUND

Inventive concepts relate to a semiconductor package, and more particularly, to a semiconductor package including a cache memory.

According to the rapid development of the electronics industry and the needs of users, electronic devices and semiconductor packages mounted on electronic devices may be required to have further miniaturization, high performance, and large capacity. In order to implement this, research and development of a semiconductor package including a logic semiconductor chip and a memory semiconductor chip have been conducted.

SUMMARY

Inventive concepts provide a semiconductor package that implements high performance.

According to an embodiment of inventive concepts, a semiconductor package may include a base wiring structure; a first bridge chip and a cache memory chip on the base wiring structure, the first bridge chip and the cache memory chip being spaced apart from each other in a horizontal direction; and a plurality of logic semiconductor chips adjacent to each other on the first bridge chip and the cache memory chip. The plurality of logic semiconductor chips each may include a cache memory. The first bridge chip may overlap at least two of the plurality of logic semiconductor chips in a vertical direction, and the first bridge chip may include a plurality of first bridge wirings electrically connecting at least two of the plurality of logic semiconductor chips. The cache memory chip may overlap the cache memory of at least one of the plurality of logic semiconductor chips in the vertical direction. The cache memory chip may be electrically connected to the cache memory of at least one of the plurality of logic semiconductor chips.

According to an embodiment of inventive concepts, a semiconductor package may include a base wiring structure; a first bridge chip, a second bridge chip, and a cache memory chip on the base wiring structure and spaced apart from each other in a horizontal direction; a plurality of logic semiconductor chips adjacent to each other on the first bridge chip and the cache memory chip, the plurality of logic semiconductor chips each including a cache memory; a plurality of memory semiconductor structures on the second bridge chip along a perimeter of the plurality of logic semiconductor chips; and a plurality of conductive posts on the base wiring structure. The plurality of conductive posts may be spaced apart from the cache memory chip, the first bridge chip, and the second bridge chip in the horizontal direction. The plurality of conductive posts may electrically connect the plurality of logic semiconductor chips and the plurality of memory semiconductor structures to the base wiring structure. The first bridge chip may include a plurality of first bridge wirings electrically connecting at least two of the plurality of logic semiconductor chips to each other. The second bridge chip may include a plurality of second bridge wirings electrically connecting at least one of the plurality of logic semiconductor chips to at least one of the plurality of memory semiconductor structures. The cache memory chip may overlap the cache memory of at least one of the plurality of logic semiconductor chips in a vertical direction. The cache memory chip may be electrically connected to the cache memory of at least one of the plurality of logic semiconductor chips.

According to an embodiment of inventive concepts, a semiconductor package may include a base wiring structure; a first bridge chip, a second bridge chip, and a plurality of cache memory chips on the base wiring structure and spaced apart from each other in a horizontal direction; four logic semiconductor chips disposed adjacent to each other on the first bridge chip and the plurality of cache memory chips; a plurality of memory semiconductor structures on the second bridge chip along a perimeter of the four logic semiconductor chips; a plurality of conductive posts on the base wiring structure; and an encapsulant on the base wiring structure. A lower surface of the first bridge chip, a lower surface of the second bridge chip, and lower surfaces of the plurality of cache memory chips each may be at a same vertical level. The four logic semiconductor chips each may have a cache memory. The plurality of conductive posts may be spaced apart from the cache memory chip, the first bridge chip, and the second bridge chip in the horizontal direction. The plurality of conductive posts may electrically connect the four logic semiconductor chips and the plurality of memory semiconductor structures to the base wiring structure. The encapsulant may surround the cache memory chip, the first bridge chip, the second bridge chip, and the plurality of conductive posts. The first bridge chip may overlap at least two of the four logic semiconductor chips in a vertical direction. The first bridge chip may include a plurality of first bridge wirings electrically connecting at least two of the four logic semiconductor chips. The second bridge chip may overlap at least one of the four logic semiconductor chips in the vertical direction and the second bridge chip may overlap at least one of the plurality of memory semiconductor structures in the vertical direction. The second bridge chip may include a plurality of second bridge wirings electrically connecting at least one of the four logic semiconductor chips to at least one of the plurality of memory semiconductor structures. Each of the plurality of cache memory chips may overlap the cache memory of at least one of the four logic semiconductor chips in the vertical direction. Each of the plurality of cache memory chips may be electrically connected to the cache memory of at least one of the four logic semiconductor chips.

BRIEF DESCRIPTION OF THE DRAWINGS

Embodiments of inventive concepts will be more clearly understood from the following detailed description taken in conjunction with the accompanying drawings in which.

DETAILED DESCRIPTION

Figure 1:
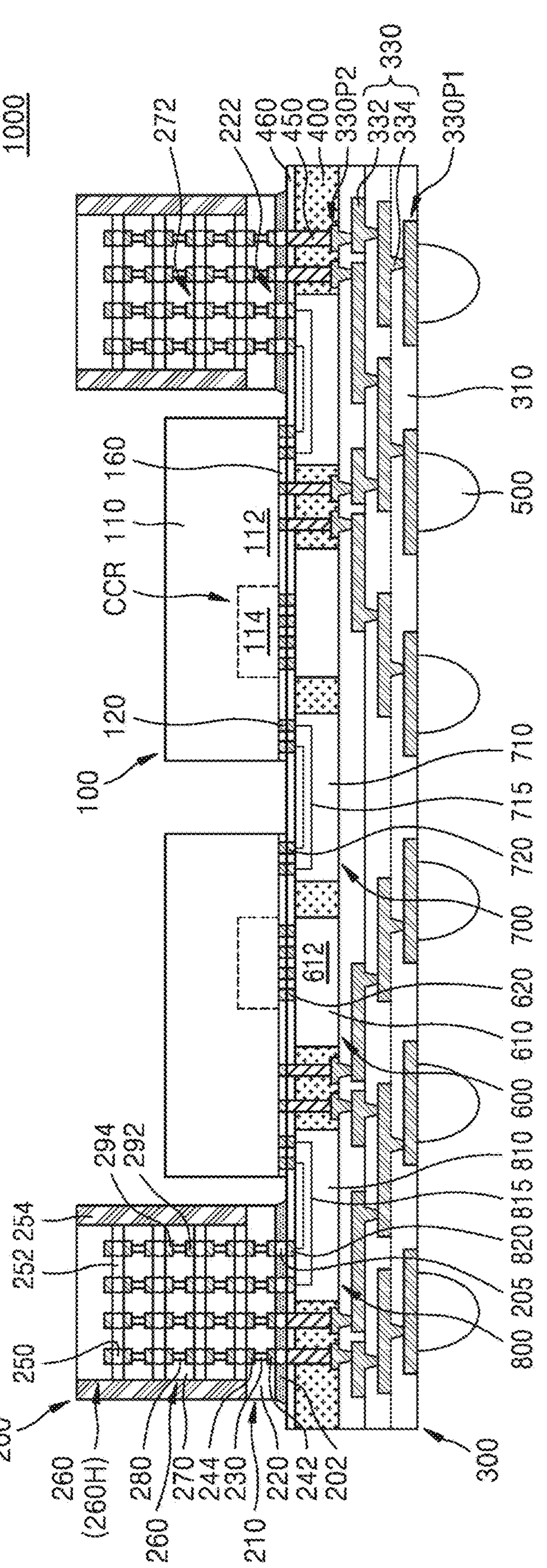
FIG. 1 is a cross-sectional view of a semiconductor package according to some embodiments.
Figure 2:
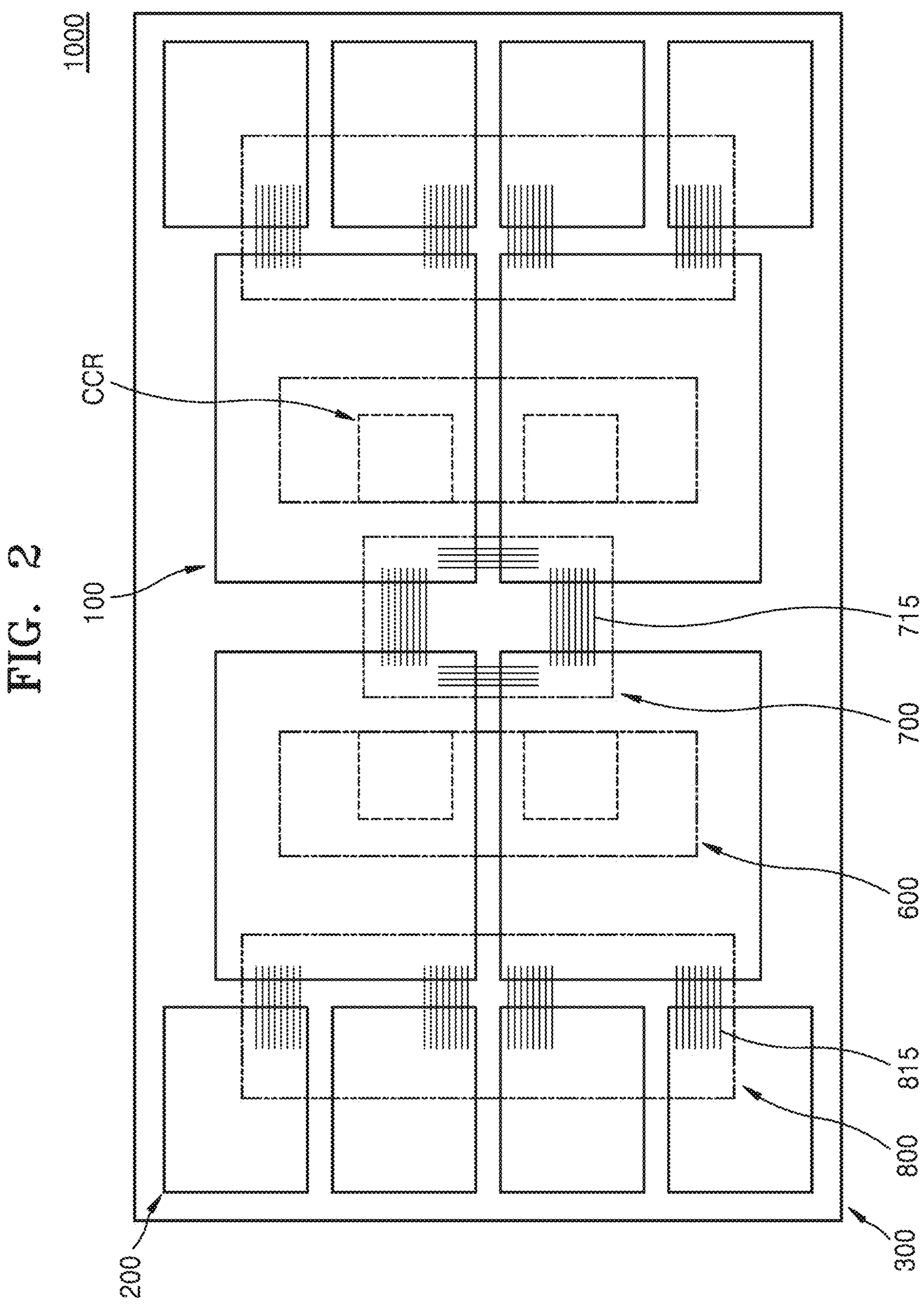
FIG. 2 is a plan layout view of the semiconductor package according to some embodiments.

FIG. 1 is a cross-sectional view of a semiconductor package according to some embodiments, and FIG. 2 is a plan layout view of the semiconductor package according to some embodiments.

Referring to FIGS. 1 and 2 together, a semiconductor package 1000 may include a base wiring structure 300, a plurality of cache memory chips 600 disposed on the base wiring structure 300, a plurality of logic semiconductor chips 100 disposed on the plurality of cache memory chips 600, and a plurality of memory semiconductor structures 200 disposed around the plurality of logic semiconductor chips 100. The semiconductor package 1000 may further include a first bridge chip 700, a second bridge chip 800, a plurality of conductive posts 450 disposed on the base wiring structure 300, and an encapsulant 400 surrounding the first bridge chip 700, the second bridge chip 800, and the plurality of conductive posts 450.

The plurality of logic semiconductor chips 100 may be disposed on the base wiring structure 300 so as to be adjacent to each other but spaced apart from each other in a horizontal direction. The plurality of memory semiconductor structures 200 may be disposed on the base wiring structure 300 so as to be spaced apart from each other in the horizontal direction and respectively spaced apart from the plurality of logic semiconductor chips 100 in the horizontal direction. The plurality of memory semiconductor structures 200 may be disposed along the entire circumference of the plurality of logic semiconductor chips 100. Each of the plurality of memory semiconductor structures 200 may be adjacent to at least one of the plurality of logic semiconductor chips 100. FIG. 2 illustrates that the semiconductor package 1000 includes four logic semiconductor chips 100 and eight memory semiconductor structures 200, but inventive concepts are not limited thereto. For example, the semiconductor package 1000 may include two, three, or five or more logic semiconductor chips 100, and may include four, six, or ten or more memory semiconductor structures 200. FIGS. 1 and 2 illustrate that the plurality of memory semiconductor structures 200 are disposed both directions of the entire plurality of logic semiconductor chips 100 in the horizontal direction, that is, on both sides, but inventive concepts are not limited thereto. The plurality of memory semiconductor structures 200 may be disposed in four directions of the entire plurality of logic semiconductor chips 100.

The first bridge chip 700 may be disposed between the base wiring structure 300 and the plurality of logic semiconductor chips 100 so as to overlap the plurality of logic semiconductor chips 100 in a vertical direction. FIGS. 1 and 2 illustrate that one first bridge chip 700 overlaps four logic semiconductor chips 100 in the vertical direction, but inventive concepts are not limited thereto. For example, each of two or more first bridge chips 700 may overlap at least two logic semiconductor chips 100 among the plurality of logic semiconductor chips 100 in the vertical direction.

The second bridge chip 800 may be disposed over between the base wiring structure 300 and the plurality of logic semiconductor chips 100 and between the base wiring structure 300 and the plurality of memory semiconductor structures 200 so as to overlap the plurality of logic semiconductor chips 100 and the plurality of memory semiconductor structures 200 in the vertical direction. FIGS. 1 and 2 illustrate that each of two second bridge chips 800 overlaps two logic semiconductor chips 100 and four memory semiconductor structures 200 in the vertical direction, but this is exemplary and inventive concepts are not limited thereto. For example, each of the plurality of second bridge chips 800 may overlap at least one logic semiconductor chip 100 among the plurality of logic semiconductor chips 100 and at least one memory semiconductor structure 200 among the plurality of memory semiconductor structures 200 in the vertical direction.

Some of the plurality of conductive posts 450 may electrically connect the base wiring structure 300 and the plurality of logic semiconductor chips 100, and others of the plurality of conductive posts 450 may electrically connect the base wiring structure 300 and the plurality of memory semiconductor structures 200.

In some embodiments, the base wiring structure 300 may be formed by a redistribution process. The base wiring structure 300 may be referred to as a redistribution structure. Hereinafter, a case in which the base wiring structure 300 is formed by the redistribution process is described, but inventive concepts are not limited thereto. For example, in some embodiments, the base wiring structure 300 may be a printed circuit board.

The base wiring structure 300 may include a base redistribution insulating layer 310 and a plurality of base redistribution patterns 330. The base redistribution insulating layer 310 may surround the plurality of base redistribution patterns 330. In some embodiments, the base interconnection structure 300 may include a plurality of stacked base interconnection insulating layers 310. The base redistribution insulating layer 310 may be made of, for example, a photo imageable dielectric (PID) or a photosensitive polyimide (PSPI). For example, the base interconnection structure 300 may have a thickness of about 30 μm to about 50 μm.

The plurality of base redistribution patterns 330 may include a plurality of base redistribution line patterns 332 and a plurality of base redistribution vias 334. The plurality of base redistribution patterns 330 may include, for example, metals such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), etc. or alloys of metals, but is not limited thereto. In some embodiments, the plurality of base redistribution patterns 330 may be formed by stacking metals or alloys of metals on a seed layer including copper, titanium, titanium nitride, or titanium tungsten.

The plurality of base redistribution line patterns 332 may be disposed on at least one of an upper surface or a lower surface of the base redistribution insulating layer 310. For example, when the base wiring structure 300 includes a plurality of stacked base redistribution insulating layers 310, the plurality of base redistribution line patterns 332 may be disposed on at least some of an upper surface of the uppermost base redistribution insulating layer 310, a lower surface of the lowermost base redistribution insulating layer 310, and between two adjacent base redistribution insulating layers 310 among the plurality of base redistribution insulating layers 310.

The plurality of base redistribution vias 334 may pass through at least one base redistribution insulating layer 310 to contact and connect to some of the plurality of base redistribution line patterns 332, respectively. In some embodiments, each of the plurality of base redistribution vias 334 may have a tapered shape in which a horizontal width thereof increases and extends from a lower side to an upper side. For example, the horizontal width of each of the plurality of base redistribution vias 334 may increase as each of the plurality of base redistribution vias 334 approaches the plurality of logic semiconductor chips 100 and the plurality of memory semiconductor structures 200.

In some embodiments, at least some of the plurality of base redistribution line patterns 332 may be integrally formed with some of the plurality of base redistribution vias 334. For example, the base redistribution line pattern 332 may be integrally formed with the base redistribution via 334 contacting a lower surface of the base redistribution line pattern 33. For example, the horizontal width of each of the plurality of base redistribution vias 334 may decrease as each of the plurality of base redistribution vias 334 moves away from the base redistribution line pattern 332 integrally formed therewith.

Some of the plurality of base redistribution patterns 330 disposed adjacent to the lower surface of the base wiring structure 300 may be referred to as a plurality of lower connection pads 330P1, and some of the plurality of base redistribution patterns 330 disposed adjacent to the upper surface of the base wiring structure 300 may be referred to as a plurality of upper connection pads 330P2. For example, the plurality of lower connection pads 330P1 may be some of the plurality of base redistribution line patterns 332 disposed adjacent to the lower surface of the base wiring structure 300, and the plurality of upper connection pads 330P2 may be some of the plurality of base redistribution line patterns 332 disposed adjacent to the upper surface of the base wiring structure 300.

A plurality of external connection terminals 500 may be respectively attached to the plurality of lower connection pads 330P1. The plurality of external connection terminals 500 may connect the semiconductor package 1000 to the outside. In some embodiments, lower surfaces of the plurality of lower connection pads 330P1 and the lower surface of the lowermost base redistribution insulating layer 310 may be coplanar. For example, each of the plurality of external connection terminals 500 may be a bump, a solder ball, etc. For example, each of the plurality of external connection terminals 500 may have a height of about 100 μm to about 180 μm.

The plurality of upper connection pads 330P2 may be disposed on the upper surface of the base redistribution insulating layer 310. For example, when the base wiring structure 300 includes the plurality of stacked base redistribution insulating layers 310, the plurality of upper connection pads 330P2 may be disposed on the upper surface of the uppermost base redistribution insulating layer 310. The plurality of conductive posts 450 may be respectively attached to the plurality of upper connection pads 330P2. In some embodiments, the plurality of upper connection pads 330P2 may protrude from the upper surface of the base redistribution insulating layer 310 in the vertical direction. For example, when the base wiring structure 300 includes the plurality of stacked base redistribution insulating layers 310, the plurality of upper connection pads 330P2 may protrude from the upper surface of the uppermost base redistribution insulating layer 310 in the vertical direction to the plurality of logic semiconductor chips 100 and the plurality of memory semiconductor structures 200. An upper surface and a side surface of each of the plurality of upper connection pads 330P2 may not contact the base redistribution insulating layer 310. For example, the side surface of each of the plurality of upper connection pads 330P2 may be covered by the encapsulant 400, and the upper surface thereof may be covered by the encapsulant 400 and a lower surface of the conductive post 450. The plurality of lower connection pads 330P1 may not protrude from the lower surface of the lowermost base redistribution insulating layer 310 in the vertical direction.

Each of the plurality of memory semiconductor structures 200 may include a memory device. For example, each of the plurality of memory semiconductor structures 200 may include a dynamic random access memory (DRAM) semiconductor chip, a NAND flash memory semiconductor chip, or a V-NAND flash memory semiconductor chip. In some embodiments, each of the plurality of memory semiconductor structures 200 may be a stack structure including a first semiconductor chip 210 and a plurality of second semiconductor chips 260. FIG. 1 illustrates that each of the plurality of memory semiconductor structures 200 includes one first semiconductor chip 210 and four second semiconductor chips 260, but inventive concepts are not limited thereto. For example, the memory semiconductor structure 200 may include two or more second semiconductor chips 260. In some embodiments, one memory semiconductor structure 200 may include a multiple of 4 second semiconductor chips 260. The plurality of second semiconductor chips 260 may be sequentially stacked on the first semiconductor chip 210 in the vertical direction. The first semiconductor chip 210 and the plurality of second semiconductor chips 260 may be sequentially stacked while an active surface thereof faces a lower side, that is, the base wiring structure 300.

In some embodiments, the first semiconductor chip 210 may not include a memory cell. The first semiconductor chip 210 may include a test logic circuit such as a serial-parallel conversion circuit, a design for test (DFT), a Joint Test Action Group (JTAG), and a memory built-in self-test (MBIST), and a signal interface circuit such as a PHY. The plurality of second semiconductor chips 260 may include memory cells. For example, the first semiconductor chip 210 may be a buffer chip for controlling the plurality of second semiconductor chips 260.

In some embodiments, the first semiconductor chip 210 may be a buffer chip for controlling a high bandwidth DRAM (HBM DRAM), and the plurality of second semiconductor chips 260 may be memory cell chips including cells of the HBM DRAM controlled by the first semiconductor chip 210. The first semiconductor chip 210 may be referred to as a buffer chip or a master chip, and the second semiconductor chip 260 may be referred to as a core chip, a memory cell chip, or a slave chip. For example, the memory semiconductor structure 200 including the first semiconductor chip 210 and the plurality of second semiconductor chips 260 sequentially stacked on the first semiconductor chip 210 may be formed as a HBM DRAM.

The first semiconductor chip 210 may include a first substrate 220, a plurality of first through electrodes 230, a plurality of first front connection pads 242, and a plurality of first rear connection pads 244. The second semiconductor chip 260 may include a second substrate 270, a plurality of second through electrodes 280, a plurality of second front connection pads 292, and a plurality of second rear connection pads 294.

The first substrate 220 and the second substrate 270 may include silicon (Si). Alternatively, the first substrate 220 and the second substrate 270 may include a semiconductor element such as germanium (Ge), or a compound semiconductor such as silicon carbide (SiC), gallium arsenide (GaAs), indium arsenide (InAs), and indium phosphide (InP). The first substrate 220 and the second substrate 270 may each have the active surface and an non-active surface opposite to the active surface. The first substrate 220 and the second substrate 270 may each include various types of a plurality of individual devices on the active surface. The plurality of individual devices may include various microelectronic devices, for example, a metal-oxide-semiconductor field effect transistor (MOSFET) such as a complementary metal-insulator-semiconductor transistor (CMOS), an image sensor such as system large scale integration (LSI), a CMOS imaging sensor (CIS), a micro-electro-mechanical system (MEMS), an active device, a passive device, etc. The active surface and the non-active surface of the first substrate 220 may be respectively referred to as a first active surface and a first non-active surface, and the active surface and the non-active surface of the second substrate 270 may be respectively referred to as a second active surface and a second non-active surface.

The first semiconductor chip 210 and the second semiconductor chip 260 may respectively include a first semiconductor device 222 and a second semiconductor device 272 configured by the plurality of individual devices. The first semiconductor device 222 may be disposed on the first active surface of the first substrate 220, each of the plurality of first front connection pads 242 and the plurality of first rear connection pads 244 may be disposed on the first active surface and the first non-active surface of the 220, and the plurality of first through electrodes 230 may vertically penetrate at least a part of the first substrate 220 and electrically connect the plurality of first front connection pads 242 with the plurality of first rear connection pads 244, respectively.

The second semiconductor device 272 may be formed on the second active surface of the second substrate 270, each of the plurality of second front connection pads 292 and the plurality of second rear connection pads 294 may be disposed on the second active surface and the second non-active surface of the second substrate 270, and the plurality of second through electrodes 280 may vertically penetrate at least a part of the second substrate 270 and electrically connect the plurality of second front connection pads 292 and the plurality of second rear connection pads 294, respectively. The plurality of second through electrodes 280 may be electrically connected to the plurality of first through electrodes 230, respectively.

The memory semiconductor structure 200 may be electrically connected to the base wiring structure 300 through the plurality of first front connection pads 242. In some embodiments, a plurality of first chip connections 205 may be disposed between the plurality of conductive posts 450 respectively attached on the plurality of upper connection pads 330P2 of the base wiring structure 300 and the plurality of first front connection pads 242 to electrically connect the plurality of first front connection pads 242 and the plurality of conductive posts 450, respectively. An under-fill layer 202 may surround the plurality of first chip connection terminals 205. The under-fill layer 202 may fill between the memory semiconductor structure 200 and the encapsulant 400 and between the memory semiconductor structure 200 and the second bridge chip 800. For example, the under-fill layer 202 may be made of an epoxy resin formed by using a capillary under-fill method. In some embodiments, the under-fill layer 202 may be a non-conductive film (NCF).

A plurality of second chip connection terminals 250 may be respectively attached onto the plurality of second front connection pads 292 of each of the plurality of second semiconductor chips 260. The plurality of second chip connection terminals 250 may be disposed between the plurality of first rear connection pads 244 of the first semiconductor chip 210 and the plurality of second front connection pads 292 of the lowermost second semiconductor chip 260 among the plurality of second semiconductor chips 260, and between the plurality of second front connection pads 292 of the other second semiconductor chip 260 among the plurality of second semiconductor chips 260 and the plurality of second rear surface connection pads 294 of the other semiconductor chip 260 therebelow to electrically connect the first semiconductor chip 210 with each of the plurality of second semiconductor chips 260. Each of the plurality of first chip connection terminals 205 and the plurality of second chip connection terminals 250 may be a bump or a solder ball.

In some embodiments, a second semiconductor chip 260H disposed at the uppermost end farthest from the first semiconductor chip 210 among the plurality of second semiconductor chips 260 may not include the second rear connection pad 294 and the second semiconductor chip 294. In some embodiments, a thickness of the second semiconductor chip 260H disposed at the uppermost end farthest from the first semiconductor chip 210 among the plurality of second semiconductor chips 260 may have a value greater than that of a thickness of the other second semiconductor chips 260.

An insulating adhesive layer 252 may be disposed between the first semiconductor chip 210 and each of the plurality of second semiconductor chips 260. The insulating adhesive layer 252 may be attached to the lower surface of each of the plurality of second semiconductor chips 260 to allow each of the plurality of second semiconductor chips 260 to be attached onto a lower structure, for example, the first semiconductor chip 210, or the other second semiconductor chip 260 positioned on the lower side among the plurality of second semiconductor chips 260. The insulating adhesive layer 252 may include a NCF, a non-conductive paste (NCP), an insulating polymer, or an epoxy resin. The insulating adhesive layer 252 may surround the plurality of second chip connection terminals 250 and may fill between the first semiconductor chip 210 and each of the plurality of second semiconductor chips 260.

The horizontal width and width of the first semiconductor chip 210 may be greater than the horizontal width and width of each of the plurality of second semiconductor chips 260. For example, the plurality of second semiconductor chips 260 may all overlap the first semiconductor chip 210 in the vertical direction. In some embodiments, the plurality of second semiconductor chips 260 may all overlap each other in the vertical direction.

The memory semiconductor structure 200 may further include a chip molding layer 254 surrounding the plurality of second semiconductor chips 260 and the plurality of insulating adhesive layers 252 on the upper surface of the first semiconductor chip 210, that is, the first non-active surface of the first substrate 220. The chip molding layer 254 may cover the upper surface of the first semiconductor chip 210, that is, the first non-active surface of the first substrate 212, and may cover side surfaces of the plurality of second semiconductor chips 260. In some embodiments, a side surface of the first semiconductor chip 210 and a side surface of the chip molding layer 254 corresponding to each other may be aligned in the vertical direction to form the same plane. In some embodiments, the chip molding layer 254 may cover the side surfaces of the plurality of second semiconductor chips 260, but may not cover and expose the upper surface of the second semiconductor chip 260H positioned at the uppermost end, that is, the second non-active surface of the second substrate 270 of the second semiconductor chip 260H positioned at the uppermost end. The chip molding layer 254 may be formed of, for example, EMC.

Each of the plurality of logic semiconductor chips 100 may include a third substrate 110 having an active surface and a non-active surface opposite to each other, a third semiconductor device 112 formed on the active surface of the third substrate 110, and a plurality of third front connection pads 120 disposed on a first surface of the semiconductor chip 100. In some embodiments, a chip cover insulating layer 160 surrounding side surfaces of the plurality of third front connection pads 120 may be disposed on the first surface of the logic semiconductor chip 100. For example, the chip cover insulating layer 160 may be made of SiO, SiN, SiCN, SiCO, or a polymer material. For example, the polymer material may be benzocyclobutene (BCB), polyimide (PI), polybenzoxazole (PBO), silicone, acrylate, or epoxy. In some embodiments, lower surfaces of the plurality of third front connection pads 120 and a lower surface of the chip cover insulating layer 160 may be positioned at the same vertical level to be coplanar.

For example, the logic semiconductor chip 100 may have a thickness of about 70 μm to about 120 μm. In this specification, the first surface of the logic semiconductor chip 100 and a second surface of the logic semiconductor chip 100 are opposite to each other, and the second surface of the logic semiconductor chip 100 means the non-active surface of the third substrate 110. The active surface of the third substrate 110 is very adjacent to the first surface of the logic semiconductor chip 100, and thus, an illustration of separately identifying the active surface of the third substrate 110 and the first surface of the logic semiconductor chip 100 is omitted. The active surface and the non-active surface of the third substrate 110 may be respectively referred to as a third active surface and a third non-active surface.

In some embodiments, the logic semiconductor chip 100 may have a face down arrangement in which the first surface faces the base wiring structure 300, and may be disposed on the base wiring structure 300. In this case, the first surface of the logic semiconductor chip 100 may be referred to as a lower surface of the logic semiconductor chip 100, and the second surface of the logic semiconductor chip 100 may be referred to as an upper surface of the logic semiconductor chip 100. Unless otherwise specified in the present specification, an upper surface refers to a surface facing upward in the drawing, and a lower surface refers to a surface facing downward in the drawing. In this specification, unless otherwise specified, a first surface or a front surface of a chip means a surface adjacent to an active surface of a substrate included in the chip, and a second surface or a rear surface of the chip means a non-active surface of the substrate included in the chip.

The third substrate 110 may include, for example, a semiconductor material such as silicon (Si) or germanium (Ge). Alternatively, the third substrate 110 may include a compound semiconductor material such as silicon carbide (SiC), gallium arsenide (GaAs), indium arsenide (InAs), and indium phosphide (InP). The third substrate 110 may include a conductive region, for example, a well doped with impurities. The third substrate 110 may have various device isolation structures such as a shallow trench isolation (STI) structure.

A third semiconductor device 112 and a fourth semiconductor device 114 including various types of a plurality of individual devices may be formed on the active surface of the third substrate 110. The plurality of individual devices may include various microelectronic devices, for example, a metal-oxide-semiconductor field effect transistor (MOSFET) such as a complementary metal-insulator-semiconductor transistor (CMOS), an image sensor such as system large scale integration (LSI), an active device, a passive device, etc. The plurality of individual devices may be electrically connected to the conductive region of the third substrate 110. The third semiconductor device 112 may further include a conductive wiring or a conductive plug electrically connecting at least two of the plurality of individual devices, or the plurality of individual devices to the conductive region of the third substrate 110. In addition, the plurality of individual devices may be electrically isolated from other neighboring individual devices respectively by an insulating layer.

The third semiconductor device 112 included in the logic semiconductor chip 100 may include a logic device. For example, the logic semiconductor chip 100 may be a central processing unit (CPU) chip, a graphic processing unit (GPU) chip, or an application processor (AP) chip. The fourth semiconductor device 114 included in the logic semiconductor chip 100 may include a memory device. For example, the fourth semiconductor device 114 may be a volatile memory device such as a static random access memory (SRAM), or a non-volatile memory device such as a flash memory, a phase-change random access memory (PRAM), a magnetoresistive random access memory (MRAM), a ferroelectric random access memory (FeRAM) or a resistive random access memory (RRAM). The fourth semiconductor device 114 may constitute a cache memory CCR in the logic semiconductor chip 100. The cache memory CCR may be an L2 cache. The cache memory CCR may be one of functional blocks included in the logic semiconductor chip 100. The functional block is also referred as an intellectual property (IP), and refers to a unit block divided into functional units that may be actually developed.

The plurality of cache memory chips 600 may be disposed on the base wiring structure 300 to respectively overlap the plurality of logic semiconductor chips 100 in the vertical direction. Each of the plurality of cache memory chips 600 may include a fourth substrate 610 having an active surface and a non-active surface opposite to each other, a fourth semiconductor device 612 formed on the active surface of the fourth substrate 610, and a plurality of fourth front connection pads 620. In some embodiments, each of the plurality of cache memory chips 600 may completely overlap two of the plurality of logic semiconductor chips 100 and a space therebetween in the vertical direction. In some embodiments, the plurality of cache memory chips 600 may be arranged symmetrically in the horizontal direction with respect to the first bridge chip 700 in a top-view. For example, in a top-view, some of the plurality of cache memory chips 600 may be disposed on one side of opposite sides of the first bridge chip 700, and the remaining ones of the plurality of cache memory chips 600 may be disposed on the other side of the first bridge chip 700. The number of cache memory chips 600 disposed on one side of the first bridge chip 700 may be the same as the number of cache memory chips 600 disposed on the other side of the first bridge chip 700.

FIGS. 1 and 2 illustrate that one cache memory chip 600 overlap the two logic semiconductor chips 100 in the vertical direction, but inventive concepts are not limited thereto. For example, one cache memory chip 600 may overlap one logic semiconductor chip 100 in the vertical direction, two or more cache memory chips 600 may overlap one logic semiconductor chip 100 in the vertical direction, or one cache memory chip 600 may overlap three or more logic semiconductor chips 100 in the vertical direction.

The first bridge chip 700 may be disposed on the base wiring structure 300 so as to overlap at least two logic semiconductor chips 100 among the plurality of logic semiconductor chips 100 in the vertical direction. The first bridge chip 700 may include a fifth substrate 710 having an active surface and a non-active surface opposite to each other, a plurality of first bridge wirings 715 formed on the active surface of the fifth substrate 710, and a plurality of first bridge pads 720. The second bridge chip 800 may be disposed on the base wiring structure 300 so as to overlap at least one logic semiconductor chip 100 among the plurality of logic semiconductor chips 100 and at least one memory semiconductor structure 200 among the plurality of memory semiconductor structures 200 in the vertical direction.

The second bridge chip 800 may include a sixth substrate 810 having an active surface and a non-active surface opposite to each other, a plurality of second bridge wirings 815 formed on the active surface of the sixth substrate 810, and a plurality of second bridge pads 820. The first bridge chip 700 and the second bridge chip 800 may not include a semiconductor device. For example, the first bridge chip 700 and the second bridge chip 800 may each include only a back end of line (BEOL) including a plurality of first bridge wirings 715 and a plurality of second bridge wiring 815 respectively on the fifth substrate 710 and the sixth substrate 810, and may not include a front end of line (FEOL) in which a semiconductor device is formed.

Each of the fourth substrate 610, the fifth substrate 710, and the sixth substrate 810 is substantially similar to the first substrate 220, the second substrate 270, or the third substrate 110, and thus, a detailed description thereof is omitted. The active surface and the non-active surface of the fourth substrate 610 may be respectively referred to as a fourth active surface and a fourth non-active surface, the active surface and the non-active surface of the fifth substrate 710 may be respectively referred to as a fifth active surface and a fifth non-active surface, and the active surface and the non-active surface of the sixth substrate 810 may be respectively referred to as a sixth active surface and a sixth non-active surface.

Each of the plurality of cache memory chips 600, the first bridge chip 700, and the second bridge chip 800 may have a face up arrangement in which the non-active surface of each of the fourth substrate 610, the fifth substrate 710, and the sixth substrate 810 faces the base wiring structure 300, and may be disposed on the base wiring structure 300. The plurality of cache memory chips 600 may be disposed on the base wiring structure 300 such that the fourth active surface of the fourth substrate 610 faces the plurality of logic semiconductor chips 100. The first bridge chip 700 may be disposed on the base wiring structure 300 such that the fifth active surface of the fifth substrate 710 faces the plurality of logic semiconductor chips 100. The second bridge chip 800 may be disposed on the base wiring structure 300 such that the sixth active surface of the sixth substrate 810 faces the plurality of logic semiconductor chips 100 and the plurality of memory semiconductor structures 200.

In some embodiments, a lower surface of each of the plurality of conductive posts 450, the plurality of cache memory chips 600, the first bridge chip 700, and the second bridge chip 800 may be positioned at substantially the same vertical level.

In some embodiments, an upper surface of each of the plurality of conductive posts 450, the plurality of fourth front connection pads 620, the plurality of first bridge pads 720, and the plurality of second bridge pads 820 may be positioned at substantially the same vertical level.

The fourth semiconductor device 612 included in the cache memory chip 600 may be a volatile memory device such as a SRAM, or a nonvolatile memory device such as a flash memory, a PRAM, a MRAM, a FeRAM, or a RRAM. The cache memory chip 600 may be an L3 cache. The cache memory chip 600 and the cache memory CCR of the logic semiconductor chip 100 may at least partially overlap each other in the vertical direction.

Some of the plurality of third front connection pads 120 included in the logic semiconductor chip 100 and at least some of the plurality of fourth front connection pads 620 included in the cache memory chip 600 may overlap each other in the vertical direction. In some embodiments, some of the plurality of third front connection pads 120 included in the logic semiconductor chip 100 may be in contact with and electrically connected to at least some of the plurality of fourth front connection pads 620 included in the cache memory chip 600, respectively. Among the plurality of third front connection pads 120 included in the logic semiconductor chip 100, the third front connection pads 120 connected to at least some of the plurality of fourth front connection pads 620 may be connected to the cache memory CCR. For example, among the plurality of third front connection pads 120 included in the logic semiconductor chip 100, the third front connection pads 120 connected to at least some of the plurality of fourth front connection pads 620 may input/output data into/from the cache memory CCR.

The plurality of first bridge pads 720 included in the first bridge chip 700 may overlap some of the plurality of third front connection pads 120 included in each of the plurality of logic semiconductor chips 100 in the vertical direction. Some of the plurality of first bridge pads 720 included in the first bridge chip 700 may be respectively connected to ends of the plurality of first bridge wirings 715, and others of the plurality of first bridge pads 720 may be respectively connected to other ends of the plurality of first bridge wirings 715. For example, some of the plurality of first bridge pads 720 respectively connected to the ends of the plurality of first bridge wirings 715 may be in contact with and respectively connected to some of the plurality of third front connection pads 120 including one logic semiconductor chip 100 among the plurality of logic semiconductor chips 100, and others of the plurality of first bridge pads 720 respectively connected to the other ends of the plurality of first bridge wirings 715 may be in contact with and respectively connected to some of the plurality of third front connection pads 120 including another logic semiconductor chip 100 among the plurality of logic semiconductor chips 100.

The plurality of second bridge pads 820 included in the second bridge chip 800 may respectively overlap some of the plurality of third front connection pads 120 included in each of the plurality of logic semiconductor chips 100 and some of the plurality of first front connection pads 242 included in each of the plurality of memory semiconductor structures 200 in the vertical direction. Some of the plurality of second bridge pads 820 included in the second bridge chip 800 may be respectively connected to ends of the plurality of second bridge wirings 815, and others of the plurality of second bridge pads 820 may be respectively connected to other ends of the plurality of second bridge wirings 815. For example, the second bridge pads 820 connected to ends of the plurality of second bridge wirings 815 may be in contact with and respectively connected to some of the plurality of third front connection pads 120 included in the plurality of logic semiconductor chips 100, and the second bridge pads 820 connected to the other ends of the plurality of second bridge wirings 815 may be in contact with and respectively connected to some of the plurality of first front connection pads 242 included in the plurality of memory semiconductor structures 200. In some embodiments, some of the plurality of first chip connection terminals 205 may be disposed between the second bridge pads 820 connected to the other ends of the plurality of second bridge wirings 815 and some of the plurality of first front connection pads 242 included in the plurality of memory semiconductor structures 200 and may electrically connect the second bridge pads 820 to some of the plurality of first front connection pads 242.

The plurality of conductive posts 450 may be respectively spaced apart from the plurality of cache memory chips 600, the first bridge chip 700, and the second bridge chip 800 in the horizontal direction and disposed on the base wiring structure 300. For example, each of the plurality of conductive posts 450 may include copper (Cu) or a copper alloy. Some of the plurality of conductive posts 450 may electrically connect the plurality of logic semiconductor chips 100 to the base wiring structure 300, and others of the plurality of conductive posts 450 may electrically connect the plurality of memory semiconductor structures 200 to the base wiring structure 300. In some embodiments, some of the plurality of conductive posts 450 electrically connecting the plurality of logic semiconductor chips 100 to the base wiring structure 300 may be in contact with some of the plurality of third front connection pads 120. In some embodiments, others of the plurality of first chip connection terminals 205 may be disposed between others of the plurality of conductive posts 450 electrically connecting the plurality of memory semiconductor structures 200 to the base wiring structure 300 and others of the plurality of first front connection pads 242 may electrically connect others of the plurality of conductive posts 450 to others of the plurality of first front connection pads 242.

The encapsulant 400 may be a molding member including an epoxy mold compound (EMC). The encapsulant 400 may contain a filler. For example, the filler may be made of a ceramic-based material having non-conductive insulating properties. In some embodiments, the filler may be made of at least one of AlN, BN, $Al_2O_3$, SiC, or MgO. For example, the filler may be a silica filler or an alumina filler. For example, the encapsulant 400 may be made of an epoxy-based material containing the filler. An average diameter of the filler contained in the encapsulant 400 may be about 3 μm to about 50 μm. A ratio of the filler contained in the encapsulant 400 may be about 60 wt % to about 90 wt %.

In some embodiments, upper sides of the plurality of conductive posts 450, the plurality of fourth front connection pads 620, the plurality of first bridge pads 720, and the plurality of second bridge pads 820 may protrude upward from the upper surface of the encapsulant 400. A pad cover insulating layer 460 surrounding the upper sides of the plurality of conductive posts 450 and side surfaces of the plurality of fourth front connection pads 620, the plurality of first bridge pads 720, and the plurality of second bridge pads 820 may be disposed on the encapsulant 400. In some embodiments, an upper surface of each of the plurality of conductive posts 450, the plurality of fourth front connection pads 620, the plurality of first bridge pads 720, and the plurality of second bridge pads 820 and an upper surface of the pad cover insulating layer 460 may be positioned at the same vertical level to be coplanar.

In some embodiments, hybrid bonding may be performed in which the chip cover insulating layer 160 and the pad cover insulating layer 460 are bonded by forming a covalent bond, and at least some of the plurality of conductive posts 450, each of at least some of the plurality of fourth front connection pads 620, the plurality of first bridge pads 720, and the plurality of second bridge pads 820, and each of the plurality of third front connection pads 120 are in contact with each other and are combined by diffusion bonding so as to be integral through diffusion of metal atoms contained therein.

In the semiconductor package 1000 according to inventive concepts, the plurality of logic semiconductor chips 100 may be electrically connected through the first bridge chip 700, and the plurality of logic semiconductor chips 100 and the plurality of memory semiconductor structures 200 may be electrically connected to each other, and thus, an electrical connection path between the plurality of logic semiconductor chips 100 and the plurality of memory semiconductor structures 200 in the semiconductor package 1000 may be shortened.

In addition, in the semiconductor package 1000 according to inventive concepts, the cache memory CCR and the cache memory chip 600 included in the logic semiconductor chip 100 overlap at least partially in the vertical direction, and thus, an electrical connection path between the cache memory CCR and the cache memory chip 600 may be shortened. Accordingly, the cache memory chip 600 that is not included in the logic semiconductor chip 100 may be used as the L3 cache of the logic semiconductor chip 100. The plurality of cache memory chips 600 are positioned at different vertical levels from the plurality of logic semiconductor chips 100, and thus, the logic semiconductor chip 100 may use the cache memory chip 600 having a large capacity as the L3 cache, without increasing a horizontal area of the semiconductor chip 100.

Accordingly, the semiconductor package 1000 according to inventive concepts may be implemented with high performance because a data transfer path is shortened and the L3 cache used by the logic semiconductor chip 100 is increased.

FIGS. 3A to 3D are plan layout views of a semiconductor package according to some embodiments. Descriptions of FIGS. 3A to 3D redundant with that of FIG. 1 may be omitted.

Figure 3A:
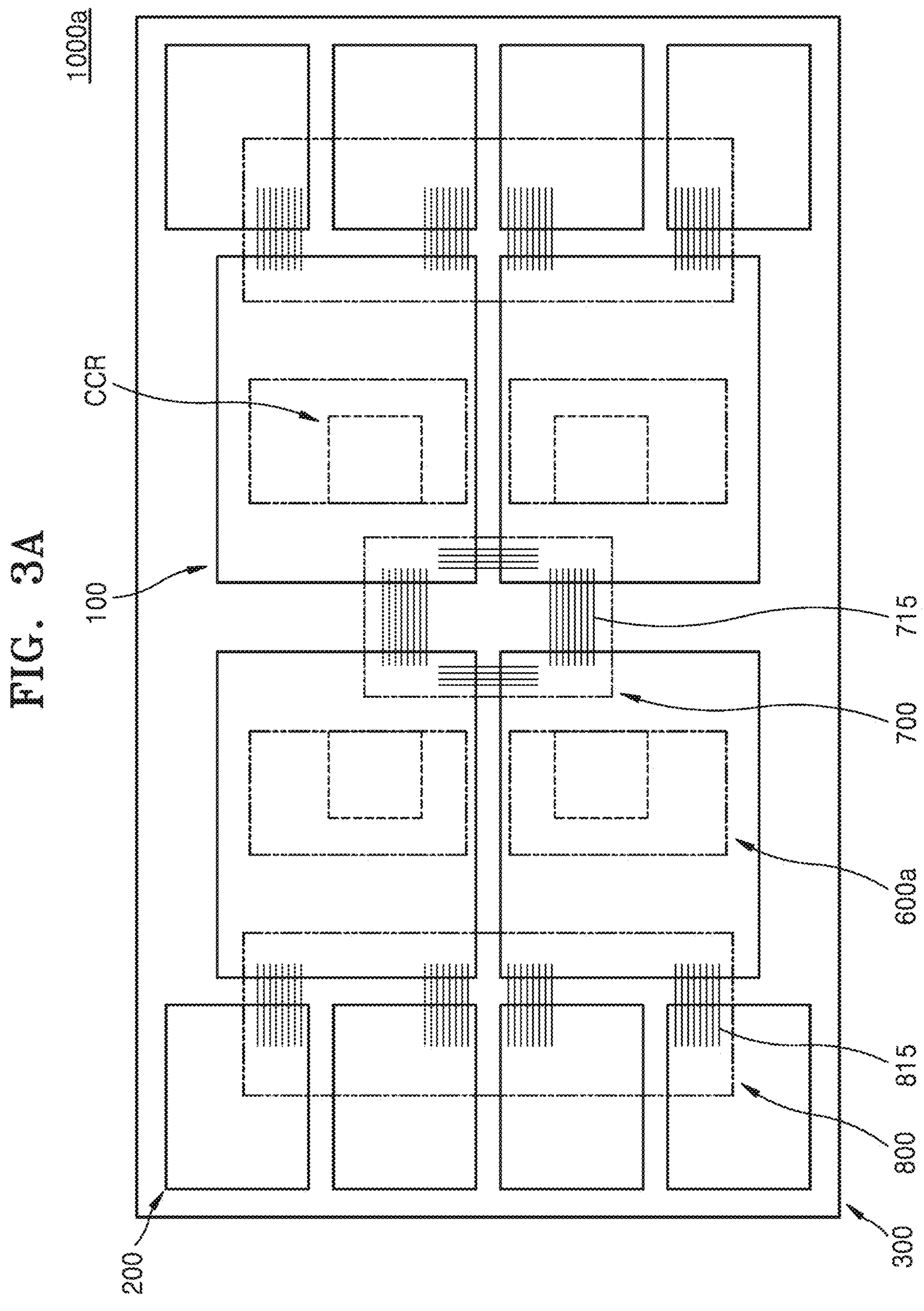
FIGS. 3A to 3D are plan layout views of a semiconductor package according to some embodiments.

Referring to FIG. 3A, a semiconductor package **1000*a* may include a plurality of cache memory chips 600*a*, the first bridge chip 700, the second bridge chip 800, the plurality of logic semiconductor chips 100 disposed on the plurality of cache memory chips 600*a* and the first bridge chip 700, and the plurality of memory semiconductor structures 200 disposed on the second bridge chip 800 around the plurality of logic semiconductor chips 100**.

The plurality of cache memory chips **600*a* may overlap the plurality of logic semiconductor chips 100 in a vertical direction. The cache memory chip 600*a* may overlap the cache memory CCR of the logic semiconductor chip 100 in the vertical direction. In some embodiments, the number of the plurality of cache memory chips 600*a* may be the same as the number of the plurality of logic semiconductor chips 100. For example, one cache memory chip 600***a* may completely overlap one logic semiconductor chip 100 in the vertical direction.

Figure 3B:
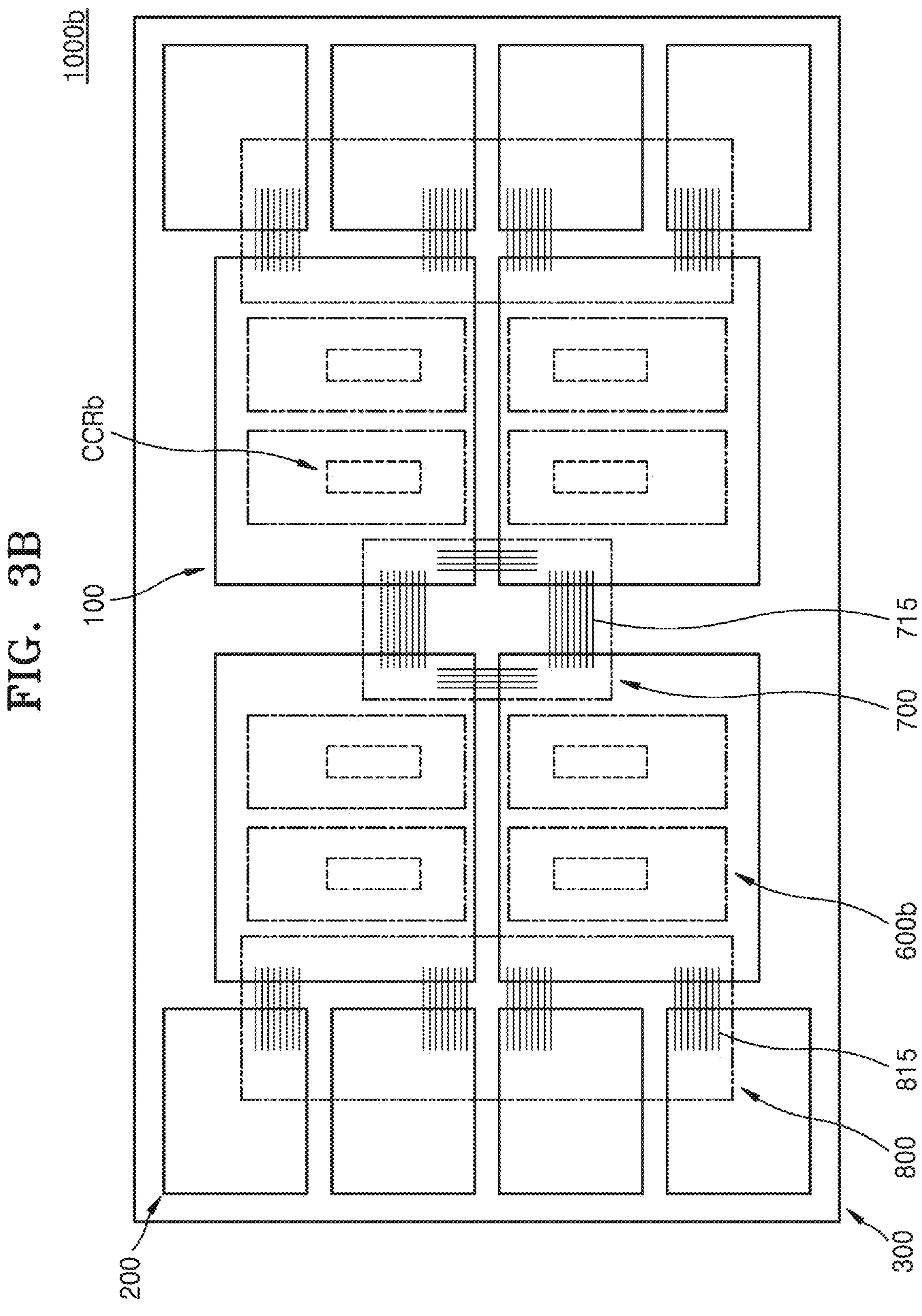

Referring to FIG. 3B, a semiconductor package 1000*b* may include a plurality of cache memory chips 600*b*, the first bridge chip 700, the second bridge chip 800, the plurality of logic semiconductor chips 100 disposed on the plurality of cache memory chips 600*b* and the first bridge chip 700, and the plurality of memory semiconductor structures 200 disposed on the second bridge chip 800 around the plurality of logic semiconductor chips 100.

Each of the plurality of logic semiconductor chips 100 may include a plurality of cache memories CCRb spaced apart from each other. The plurality of cache memory chips 600*b* may overlap the plurality of logic semiconductor chips 100 in the vertical direction. The cache memory chip 600*b* may overlap the cache memories CCRb of the logic semiconductor chip 100 in the vertical direction. In some embodiments, the number of the plurality of cache memory chips 600*b* may be greater than the number of the plurality of logic semiconductor chips 100. For example, two cache memory chips 600*b* may completely overlap one logic semiconductor chip 100 in the vertical direction. For example, the plurality of cache memories CCRb of the logic semiconductor chip 100 may respectively overlap the cache memory chips 600*b* different from each other in the vertical direction.

Figure 3C:
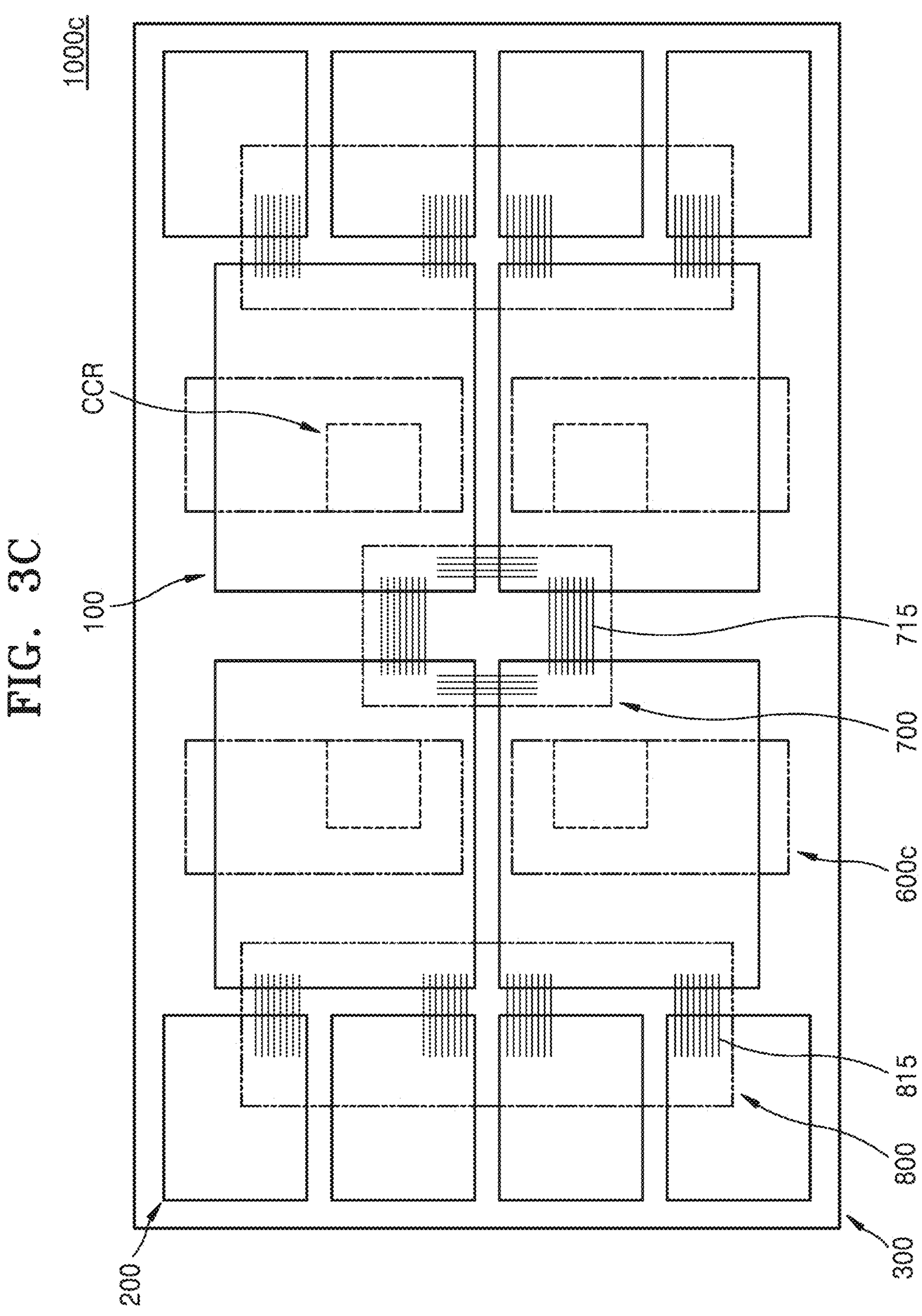

Referring to FIG. 3C, a semiconductor package 1000*c* may include a plurality of cache memory chips 600*c*, the first bridge chip 700, the second bridge chip 800, the plurality of logic semiconductor chips 100 disposed on the plurality of cache memory chips 600*c* and the first bridge chip 700, and the plurality of memory semiconductor structures 200 disposed on the second bridge chip 800 around the plurality of logic semiconductor chips 100.

The plurality of cache memory chips 600*c* may overlap the plurality of logic semiconductor chips 100 in the vertical direction. The cache memory chip 600*c* may overlap the cache memory CCR of the logic semiconductor chip 100 in the vertical direction. In some embodiments, a part of each of the plurality of cache memory chips 600*c* may not overlap the plurality of logic semiconductor chips 100 in the vertical direction. For example, a part of each of the plurality of cache memory chips 600*c* may overlap, in the vertical direction, a part where the plurality of memory semiconductor structures 200 and the plurality of logic semiconductor chips 100 are not arranged in a footprint occupied by the plurality of memory semiconductor structures 200. In some embodiments, a part of each of the plurality of cache memory chips 600*c* may protrude outward from a footprint occupied by the plurality of logic semiconductor chips 100 in a top-view.

The semiconductor package 1000*c* includes the plurality of cache memory chips 600*c* having a relatively large area so that the semiconductor package 1000*c* may be implemented with high performance because the L3 cache used by the logic semiconductor chip 100 increases.

Figure 3D:
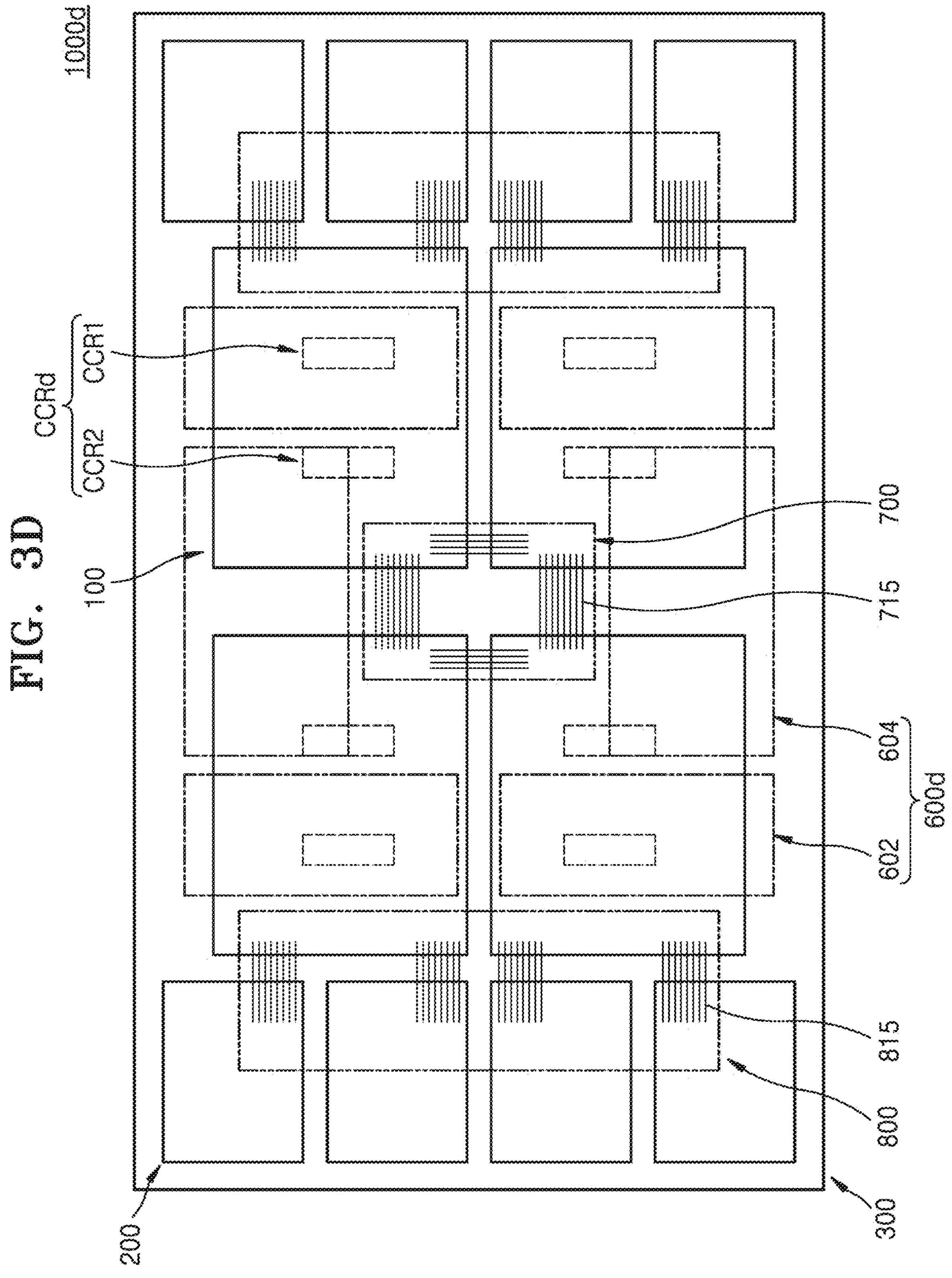

Referring to FIG. 3D, a semiconductor package 1000*d* may include a plurality of cache memory chips 600*d*, the first bridge chip 700, the second bridge chip 800, the plurality of logic semiconductor chips 100 disposed on the plurality of cache memory chips 600*d* and the first bridge chip 700, and the plurality of memory semiconductor structures 200 disposed on the second bridge chip 800 around the plurality of logic semiconductor chips 100.

Each of the plurality of logic semiconductor chips 100 may include a plurality of cache memories CCRd spaced apart from each other. The plurality of cache memory chips 600*d* may overlap the plurality of logic semiconductor chips 100 in the vertical direction. The cache memory chip 600*d* may vertically overlap the cache memory CCRd of the logic semiconductor chip 100. In some embodiments, the number of the plurality of cache memory chips 600*d* may be different from the number of the plurality of logic semiconductor chips 100. The plurality of cache memory chips 600*d* may include a first cache memory chip 602 and a second cache memory chip 604. The plurality of cache memories CCRd of the logic semiconductor chip 100 may include a first cache memory CCR1 and a second cache memory CCR2. In some embodiments, the first cache memory chip 602 may overlap one logic semiconductor chip 100 in the vertical direction, and the second cache memory chip 604 may overlap two logic semiconductor chips 100 in the vertical direction. For example, the first cache memory chip 602 may overlap and be electrically connected to the first cache memory CCR1 of one logic semiconductor chip 100 in the vertical direction, and the second cache memory chip 604 may overlap and be electrically connected to each of the second cache memories CCR2 of two logic semiconductor chips 100 in the vertical direction.

In some embodiments, the plurality of cache memory chips 600*d* may be symmetrically disposed with respect to the first bridge chip 700 in a top-view. The plurality of cache memory chips 600*d* may be disposed to surround four sides of the first bridge chip 700. For example, the first cache memory chip 602 may be disposed on both opposite sides among the four sides of the first bridge chip 700, and the second cache memory chip 604 may be disposed on other both opposite sides of the first bridge chip 700.

FIGS. 4 to 7 are cross-sectional views of semiconductor packages according to some embodiments. Descriptions of FIGS. 4 to 7 redundant with that of FIG. 1 may be omitted.

Figure 4:
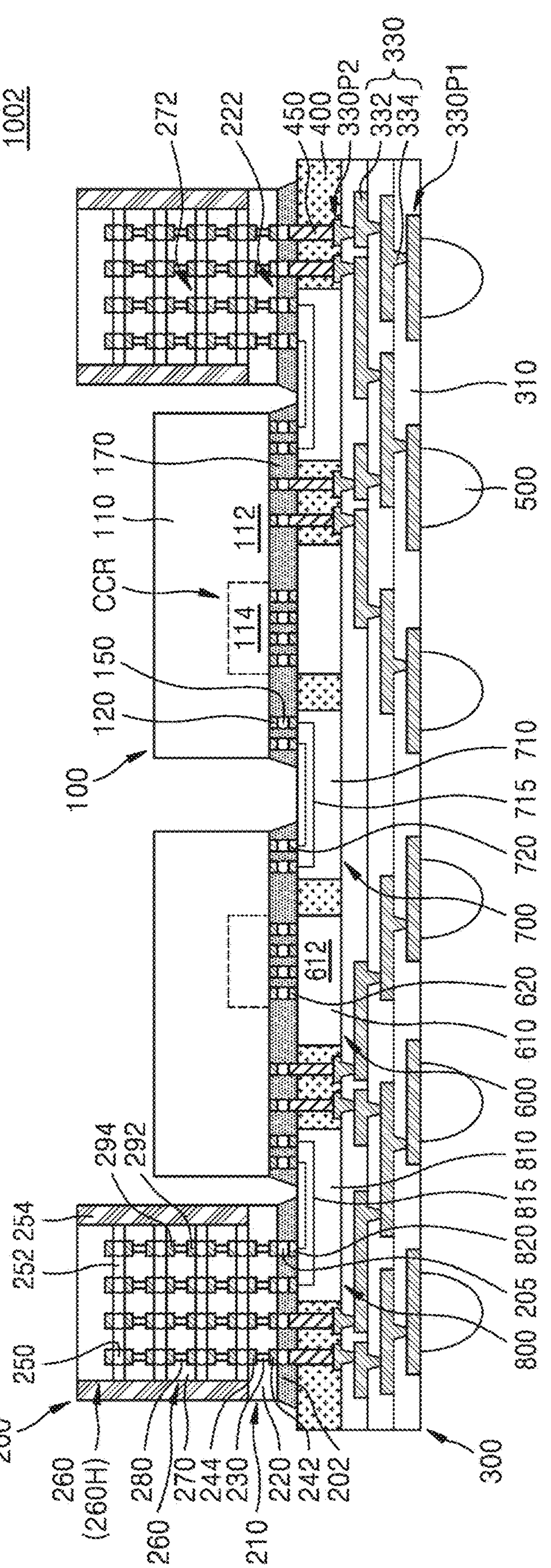
FIGS. 4 to 7 are cross-sectional views of semiconductor packages according to some embodiments.

Referring to FIG. 4, a semiconductor package 1002 may include the base wiring structure 300, the plurality of cache memory chips 600 disposed on the base wiring structure 300, the plurality of logic semiconductor chips 100 disposed on the plurality of cache memory chips 600, and the plurality of memory semiconductor structures 200 disposed around the plurality of logic semiconductor chips 100. The semiconductor package 1002 may further include the first bridge chip 700, the second bridge chip 800, and the plurality of conductive posts 450 disposed on the base wiring structure 300, and the encapsulant 400 surrounding the first bridge chip 700, the second bridge chip 800, and the plurality of conductive posts 450.

A plurality of third chip connection terminals 150 may be respectively attached onto the plurality of third front connection pads 120 of each of the plurality of logic semiconductor chips 100. The plurality of third chip connection terminals 150 may be disposed between the plurality of third front connection pads 120 and the plurality of fourth front connection pads 620, the plurality of first bridge pads 720, some of the plurality of second bridges pads 820, and some of the plurality of conductive posts 450 and may electrically connect the plurality of third front connection pads 120 to the plurality of fourth front connection pads 620, the plurality of first bridge pads 720, some of the plurality of second bridges pads 820, and some of the plurality of conductive posts 450.

An under-fill layer 170 may surround the plurality of third chip connection terminals 150. The under-fill layer 202 surrounding the plurality of first chip connection terminals 205 may be referred to as a first under-fill layer 202, and the under-fill layer 170 surrounding the plurality of third chip connection terminals 150 may be referred to as a second under-fill layer 170. The second under-fill layer 170 may fill between the logic semiconductor chip 100 and the encapsulant 400, between the logic semiconductor chip 100 and the first bridge chip 700, and between the logic semiconductor chip 100 and the second bridge 800.

Figure 5:
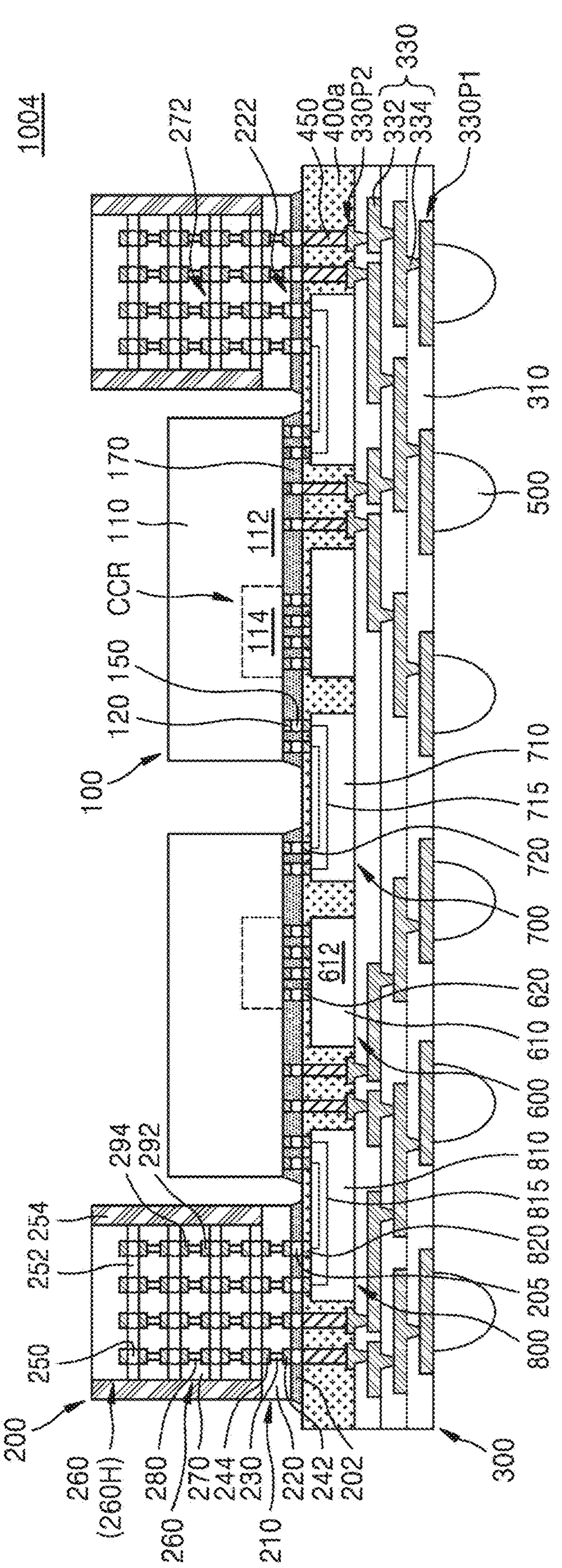

Referring to FIG. 5, a semiconductor package 1004 may include the base wiring structure 300, the plurality of cache memory chips 600 disposed on the base wiring structure 300, the plurality of logic semiconductor chips 100 disposed on the plurality of cache memory chips 600, and the plurality of memory semiconductor structures 200 disposed around the plurality of logic semiconductor chips 100. The semiconductor package 1004 may further include the first bridge chip 700, the second bridge chip 800, and the plurality of conductive posts 450 disposed on the base wiring structure 300, and an encapsulant 400*a* surrounding the first bridge chip 700, the second bridge chip 800, and the plurality of conductive posts 450.

The plurality of conductive posts 450, the plurality of fourth front connection pads 620, the plurality of first bridge pads 720, and the plurality of second bridge pads 820 may not protrude from an upper surface of the encapsulant 400*a*. In some embodiments, an upper surface of each of the plurality of conductive posts 450, the plurality of fourth front connection pads 620, the plurality of first bridge pads 720, and the plurality of second bridge pads 820 and the upper surface of the encapsulant 400*a* may be positioned at the same vertical level to be coplanar. In some embodiments, the upper surface of each of the plurality of conductive posts 450, the plurality of fourth front connection pads 620, the plurality of first bridge pads 720, and the plurality of second bridge pads 820 may be positioned at a lower vertical level than the upper surface of the encapsulant 400*a* while the encapsulant 400*a* may not cover the upper surface of each of the plurality of conductive posts 450, the plurality of fourth front connection pads 620, the plurality of first bridge pads 720, and the plurality of second bridge pads 820. For example, the encapsulant 400*a* may include a recess corresponding to the upper surface of each of the plurality of conductive posts 450, the plurality of fourth front connection pads 620, the plurality of first bridge pads 720, and the plurality of second bridge pads 820.

Figure 6:
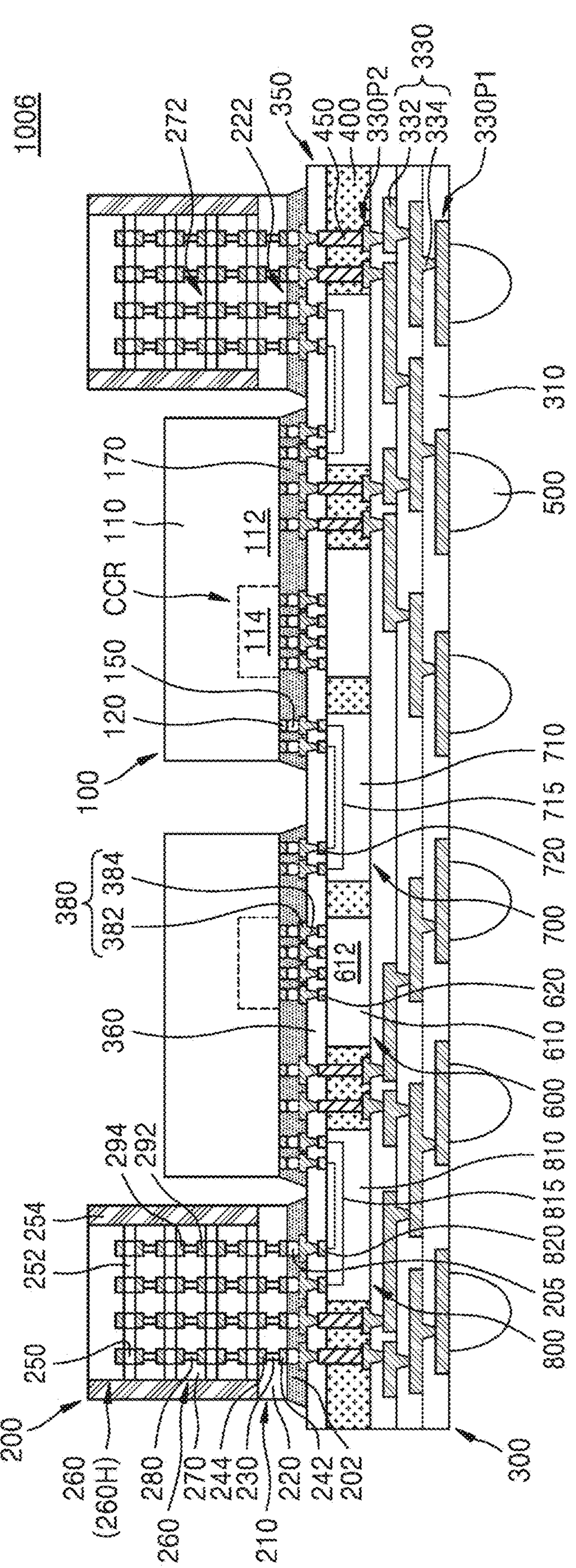

Referring to FIG. 6, a semiconductor package 1006 may include the base wiring structure 300, the plurality of cache memory chips 600 disposed on the base wiring structure 300, the plurality of logic semiconductor chips 100 disposed on the plurality of cache memory chips 600, and the plurality of memory semiconductor structures 200 disposed around the plurality of logic semiconductor chips 100. The semiconductor package 1006 may further include the first bridge chip 700, the second bridge chip 800, and the plurality of conductive posts 450 disposed on the base wiring structure 300, and the encapsulant 400 surrounding the first bridge chip 700, the second bridge chip 800, and the plurality of conductive posts 450.

A connection wiring structure 350 may be disposed between the encapsulant 400, the plurality of cache memory chips 600, the first bridge chip 700, and the second bridge chip 800, and the plurality of logic semiconductor chips 100 and the plurality of memory semiconductor structures 200.

The connection interconnection structure 350 may be formed by a redistribution process. The connection wiring structure 350 may be referred to as a connection redistribution structure. The connection wiring structure 350 may include a connection redistribution insulating layer 360 and a plurality of connection redistribution patterns 380. The connection redistribution insulating layer 360 may surround the plurality of connection redistribution patterns 380. The plurality of connection redistribution patterns 380 may include a plurality of connection redistribution line patterns 382 and a plurality of connection redistribution vias 384. In some embodiments, each of the plurality of connection redistribution vias 384 may have a tapered shape in which a horizontal width thereof increases and extends from a lower side to an upper side. For example, the horizontal width of each of the plurality of connection redistribution vias 384 may increase as each of the plurality of connection redistribution vias 384 approaches the plurality of logic semiconductor chips 100 and the plurality of memory semiconductor structures 200. The connection redistribution insulating layer 360, the connection redistribution line pattern 382, and the connection redistribution via 384 are substantially the same as the base redistribution insulating layer 310, the base redistribution line pattern 332, and the base redistribution via 334 respectively, and thus, redundant descriptions thereof are omitted.

The plurality of first chip connection terminals 205 may be respectively attached onto the plurality of first front connection pads 242 of each of the plurality of memory semiconductor structures 200, and the plurality of third chip connection terminals 150 may be respectively attached onto the plurality of third front connection pads 120 of each of the plurality of logic semiconductor chips 100.

The plurality of connection redistribution patterns 380 may be disposed between the plurality of first chip connection terminals 205 and the plurality of third chip connection terminals 150, and the plurality of fourth front connection pads 620, the plurality of first bridge pads 720, some of the plurality of second bridge pads 820, and some of the plurality of conductive posts 450 and may electrically connect the plurality of third chip connection terminals 150 to the plurality of fourth front connection pads 620, the plurality of first bridge pads 720, some of the plurality of second bridge pads 820, and some of the plurality of conductive posts 450.

Even when at least some among the plurality of fourth front connection pads 620, the plurality of first bridge pads 720, some of the plurality of second bridge pads 820, and some of the plurality of conductive posts 450 do not overlap the plurality of third front connection pads 120 in the vertical direction, the plurality of connection redistribution patterns 380 may electrically connect the plurality of fourth front connection pads 620, the plurality of first bridge pads 720, some of the plurality of second bridge pads 820, and some of the plurality of conductive posts 450 to the plurality of third front connection pads 120.

Figure 7:
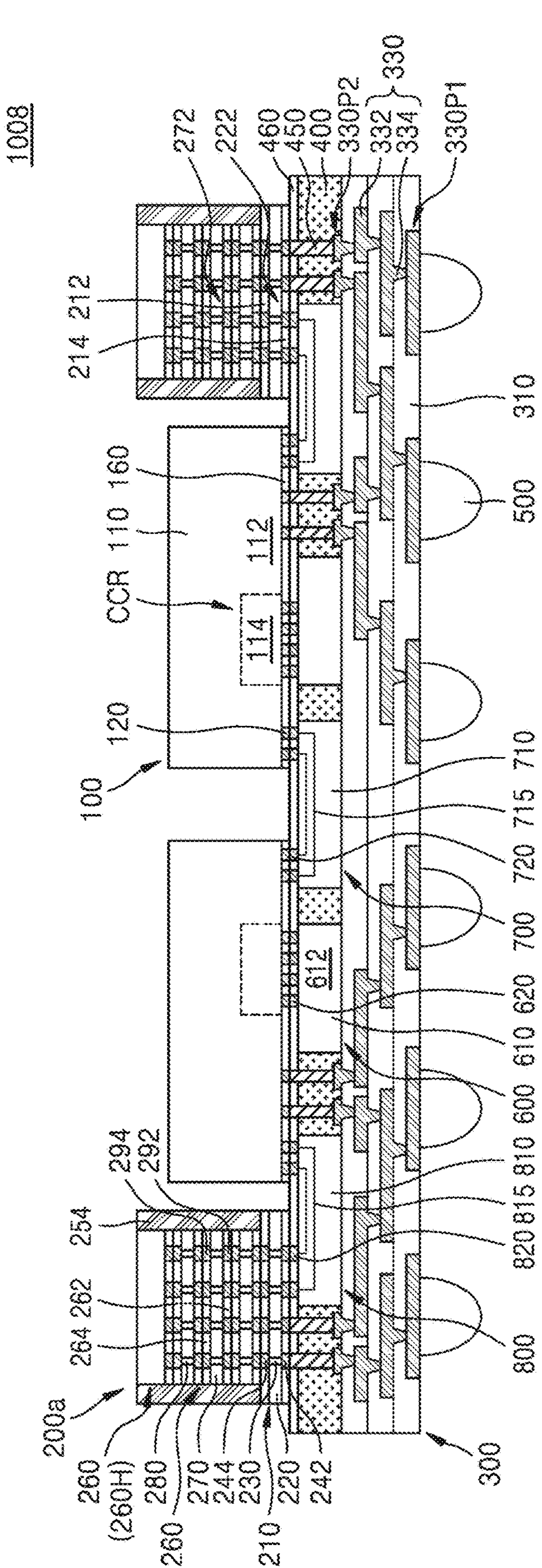

Referring to FIG. 7, a semiconductor package 1008 may include the base wiring structure 300, the plurality of cache memory chips 600 disposed on the base wiring structure 300, the plurality of logic semiconductor chips 100 disposed on the plurality of cache memory chips 600, and a plurality of memory semiconductor structures 200*a* disposed around the plurality of logic semiconductor chips 100. The semiconductor package 1008 may further include the first bridge chip 700, the second bridge chip 800, and the plurality of conductive posts 450 disposed on the base wiring structure 300, and the encapsulant 400 surrounding the first bridge chip 700, the second bridge chip 800, and the plurality of conductive posts 450.

The pad cover insulating layer 460 surrounding the upper sides of the plurality of conductive posts 450 and side surfaces of the plurality of fourth front connection pads 620, the plurality of first bridge pads 720, and the plurality of second bridge pads 820 may be disposed on the encapsulant 400.

Each of the plurality of memory semiconductor structures 200*a* may be a stack structure including the first semiconductor chip 210 and the plurality of second semiconductor chips 260. A front chip cover insulating layer 262 may be disposed on a lower surface, that is, on a front surface, of the first semiconductor chip 210 and each of the plurality of second semiconductor chips 260, and a rear chip cover insulating layer 264 may be disposed on an upper surface, that is, on a rear surface, of the first semiconductor chip 210 and each of the plurality of second semiconductor chips 260. The front chip cover insulating layer 262 covering the lower surface of the first semiconductor chip 210 may surround the plurality of first front connection pads 242, and the front chip cover insulating layer 262 covering the lower surface of each of the plurality of second semiconductor chips 260 may surround the plurality of second front connection pads 292. The rear chip cover insulating layer 264 covering the upper surface of the first semiconductor chip 210 may surround the plurality of first rear connection pads 244, and rear chip cover insulating layer 264 covering the upper surface of each of the plurality of second semiconductor chips 260 may surround the plurality of second rear connection pads 294.

Hybrid bonding may be performed in which the front chip cover insulating layer 262 and the rear chip cover insulating layer 264 corresponding to each other are bonded by forming a covalent bond, and the plurality of first rear connection pads 244 and the plurality of second front connection pads 292 corresponding to each other, and the plurality of second rear connection pads 294 and the plurality of second front connection pads 292 corresponding to each other are in contact with each other and are combined by diffusion bonding so as to be integral through diffusion of metal atoms contained therein.

The plurality of first front connection pads 242 may be electrically connected to some of the plurality of conductive posts 450 and some of the plurality of second bridge pads 820. Hybrid bonding may be performed in which the front chip cover insulating layer 262 and the pad cover insulating layer 460 are bonded by forming a covalent bond, and the plurality of first front connection pads 242 are respectively in contact with some of the plurality of conductive posts 450 and some of the plurality of second bridge pads 820 and are combined with each other by diffusion bonding so as to be integral through diffusion of metal atoms contained therein.

FIGS. 8A to 8G are cross-sectional views illustrating a method of manufacturing a semiconductor package according to some embodiments. Specifically, FIGS. 8A to 8G are cross-sectional views illustrating a method of manufacturing the semiconductor package 1000 shown in FIG. 1.

Figure 8A:
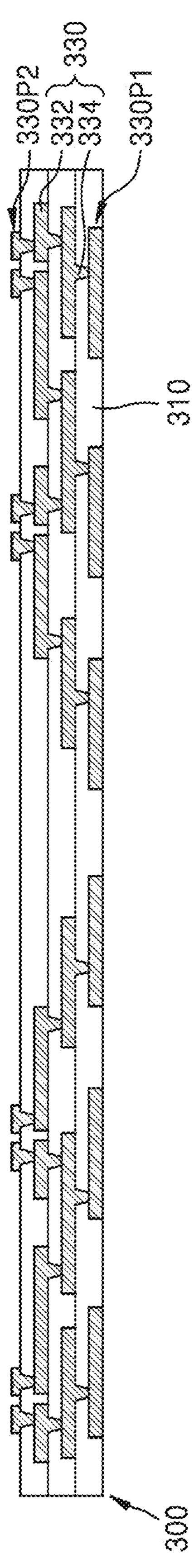
FIGS. 8A to 8G are cross-sectional views illustrating a method of manufacturing a semiconductor package according to some embodiments.

Referring to FIG. 8A, the base wiring structure 300 including the base redistribution insulating layer 310 and the plurality of base redistribution patterns 330 including the plurality of base redistribution line patterns 332 and the plurality of base redistribution vias 334 may be formed.

First, the base redistribution line patterns 332 that are the plurality of lower connection pads 330P1 may be formed, and then a first preliminary redistribution insulating layer covering the plurality of lower connection pads 330P1 may be formed. Thereafter, an exposure process may be performed to remove some parts of the first preliminary redistribution insulating layer and form the base redistribution insulating layer 310 including a plurality of first via holes. The plurality of first via holes each may be formed to have a horizontal width narrower from an upper surface to a lower surface of the base redistribution insulating layer 310. A base redistribution conductive layer may be formed on the base redistribution insulating layer 310, then, the base redistribution conductive layer may be patterned to form the base redistribution patterns 330 including the base redistribution line patterns 332 and the base redistribution vias 334. The base redistribution vias 334 may be parts of the base redistribution patterns 330 filling the plurality of first via holes, and the base redistribution line patterns 332 may be upper side parts of the base redistribution patterns 330 above the upper surface of the base redistribution insulating layer 310. Thereafter, the base wiring structure 300 may be formed by repeatedly forming the base redistribution insulating layer 310 and the base redistribution patterns 330.

The base redistribution vias 334 each may be formed to have a horizontal width narrower from the upper surface to the lower surface of the base redistribution insulating layer 310. The base redistribution patterns 330 including the base redistribution line patterns 332 and the base redistribution vias 334 may be formed by patterning the base redistribution conductive layer, so that at least some of the base redistribution line patterns 332 formed on the base redistribution insulating layer 310 including the plurality of first via holes may be integral with at least some of the base redistribution vias 334.

In some embodiments, the plurality of lower connection pads 330P1 and a lower surface of the lowermost base redistribution insulating layer 310 may be formed to be coplanar. In some embodiments, the plurality of first upper connection pads 330P2 may be formed to protrude from an upper surface of the uppermost base redistribution insulating layer 310.

Figure 8B:
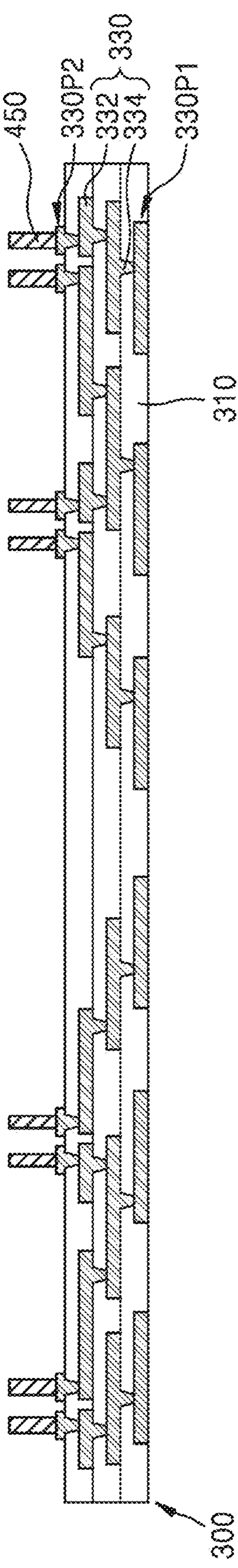

Referring to FIG. 8B, the plurality of conductive posts 450 may be formed on the plurality of first upper connection pads 330P2. In some embodiments, a mask pattern exposing at least some of the plurality of first upper connection pads 330P2 may be formed on the base wiring structure 300, and then, a plating process may be performed on each of the exposed first upper connection pads 330P2 to form the plurality of conductive posts 450. The plurality of conductive posts 450 may be formed, and then, the mask pattern may be removed.

Figure 8C:
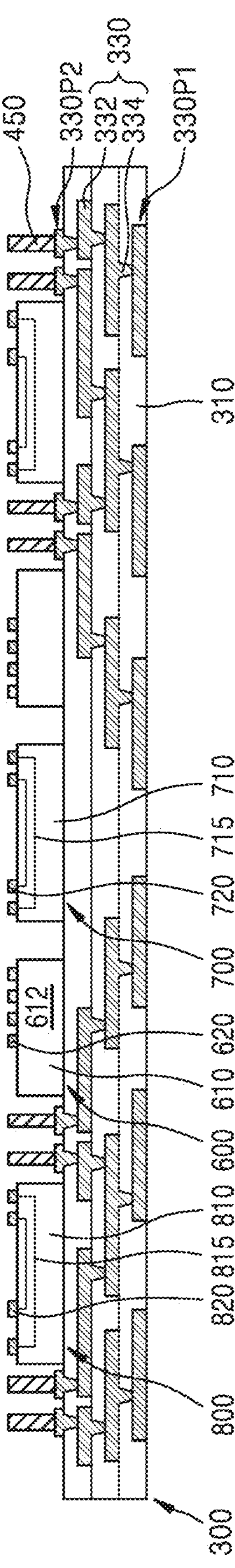

Referring to FIG. 8C, the plurality of cache memory chips 600, the first bridge chip 700, and the second bridge chip 800 may be attached onto the base wiring structure 300. The plurality of cache memory chips 600, the first bridge chip 700, and the second bridge chip 800 may be attached onto the base wiring structure 300 so as to be spaced apart from the plurality of conductive posts 450 in a horizontal direction. In some embodiments, each of the plurality of cache memory chips 600, the first bridge chip 700, and the second bridge chip 800 may be attached onto the base wiring structure 300 by using a die attach film (DAF).

Figure 8D:
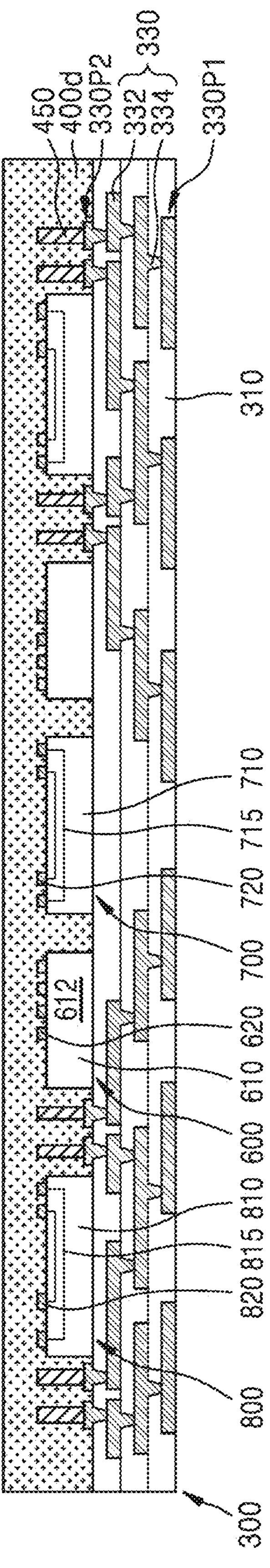

Referring to FIG. 8D, a preliminary encapsulant 400*d* surrounding the plurality of conductive posts 450, the plurality of cache memory chips 600, the first bridge chip 700, and the second bridge chip 800 may be formed on the base wiring structure 300. The preliminary encapsulant 400*d* may be formed to cover an upper surface of each of the plurality of conductive posts 450, the plurality of cache memory chips 600, the first bridge chip 700, and the second bridge chip 800.

Figure 8E:
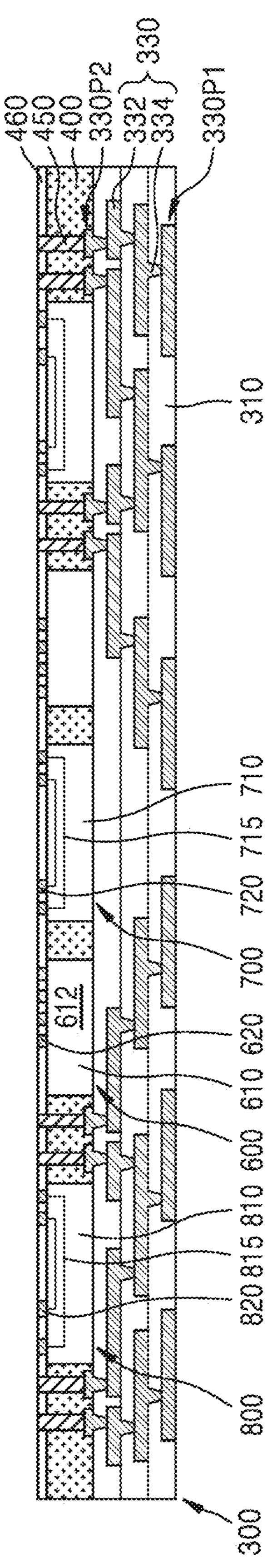

Referring to FIGS. 8D and 8E together, the encapsulant 400 may be formed by removing an upper side of the preliminary encapsulant 400*d*. The encapsulant 400 may be formed by removing the upper side of the preliminary encapsulant 400*d* so that upper sides of the plurality of conductive posts 450, the plurality of fourth front connection pads 620, the plurality of first bridge pads 720, and the plurality of second bridge pads 820 may protrude upward from the upper surface of the encapsulant 400.

The pad cover insulating layer 460 surrounding the upper sides of the plurality of conductive posts 450 and side surfaces of the plurality of fourth front connection pads 620, the plurality of first bridge pads 720, and the plurality of second bridge pads 820 may be disposed on the encapsulant 400. The cover insulating layer 460 may be formed such that an upper surface of the cover insulating layer 460 may be positioned at the same vertical level as the upper surface of each of the plurality of conductive posts 450, the plurality of fourth front connection pads 620, the plurality of first bridge pads 720, and a plurality of first bridge pads 820.

Figure 8F:
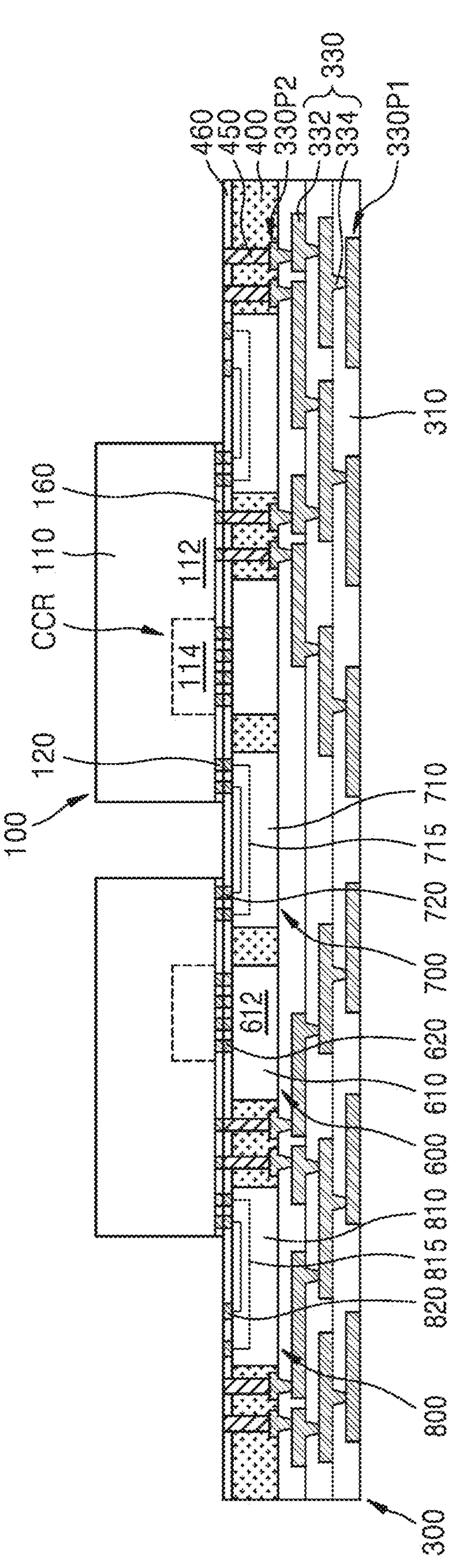

Referring to FIG. 8F, the logic semiconductor chip 100 may be attached onto the encapsulant 400, the plurality of cache memory chips 600, a part of the first bridge chip 700, and a part of the second bridge chip 800. The plurality of third front connection pads 120 included in the logic semiconductor chip 100 may be in contact with some of the plurality of conductive posts 450, at least some of the plurality of fourth front connection pads 620, some of the plurality of first bridge pads 720, and some of the plurality of second bridge pads 820.

Figure 8G:
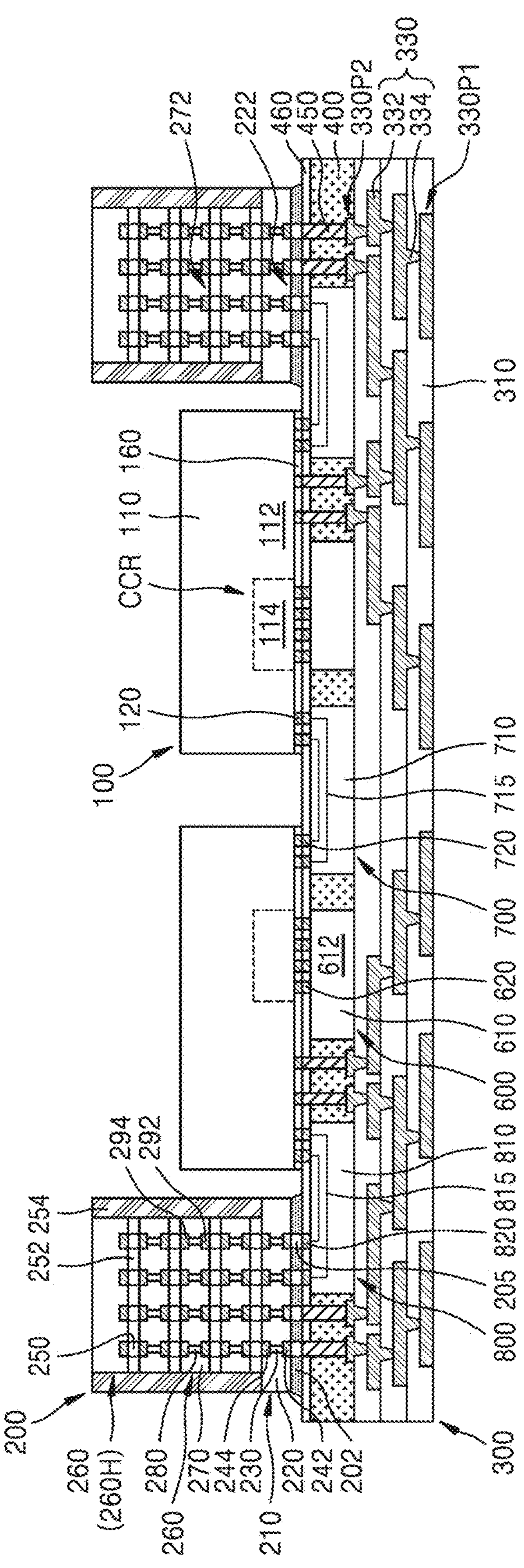

Referring to FIG. 8G, the memory semiconductor structure 200 may be attached onto the encapsulant 400 and a part of the second bridge chip 800. The plurality of the first chip connection terminals 205 may be disposed between the plurality of first front connection pads 242 included in the memory semiconductor structure 200 and others of the plurality of conductive posts 450 and others of the plurality of second bridge pads 820. Thereafter, the under-fill layer 202 surrounding the plurality of first chip connection terminals 205 and filling between the memory semiconductor structure 200 and the encapsulant 400 and between the memory semiconductor structure 200 and the second bridge chip 800 may be formed.

Thereafter, as shown in FIG. 1, the semiconductor package 1000 may be formed by attaching the plurality of external connection terminals 500 to the plurality of lower connection pads 330P1.

Figure 9A:
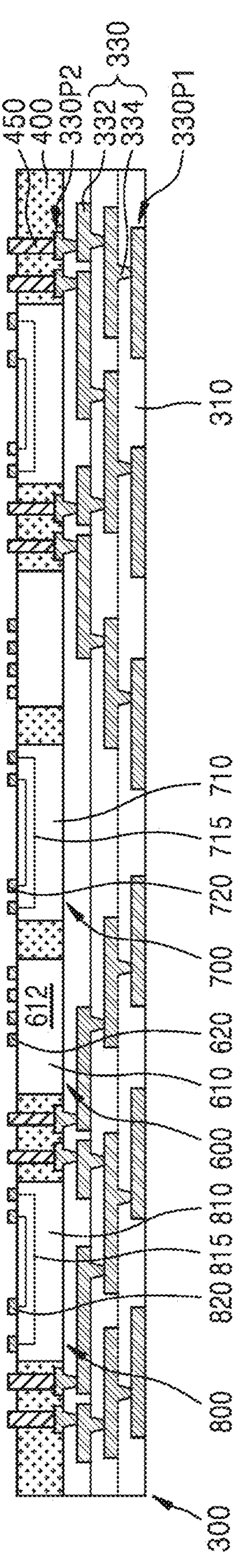
FIGS. 9A and 9B are cross-sectional views illustrating a method of manufacturing a semiconductor package according to some embodiments.
Figure 9B:
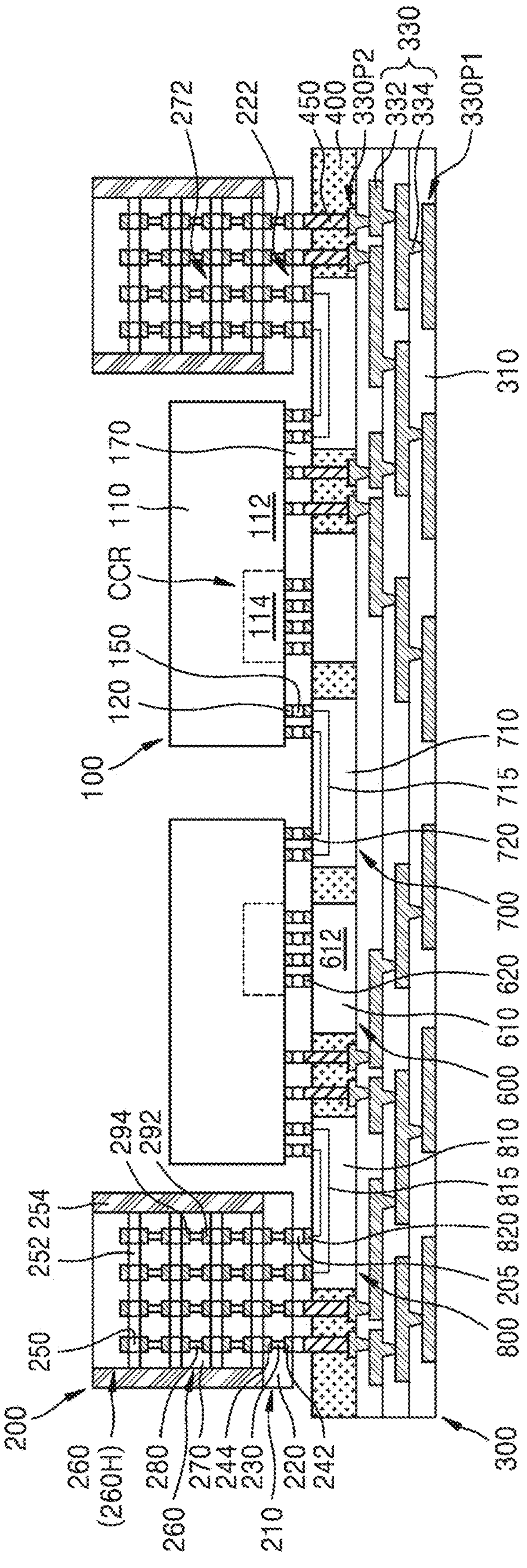

FIGS. 9A and 9B are cross-sectional views illustrating a method of manufacturing a semiconductor package according to some embodiments. Specifically, FIGS. 9A and 9B are cross-sectional views illustrating a method of manufacturing the semiconductor package 1002 shown in FIG. 4, showing operations subsequent to FIG. 8D.

Referring to FIGS. 8D and 9A together, the encapsulant 400 may be formed by removing an upper side of the preliminary encapsulant 400*d*. The encapsulant 400 may be formed by removing the upper side of the preliminary encapsulant 400*d* so that upper sides of the plurality of conductive posts 450, the plurality of fourth front connection pads 620, the plurality of first bridge pads 720, and the plurality of second bridge pads 820 may protrude upward from the upper surface of the encapsulant 400.

Referring to FIG. 9B, the logic semiconductor chip 100 and the memory semiconductor structure 200 may be attached onto a resultant of FIG. 9A. The plurality of third chip connection terminals 150 may be disposed between the plurality of third front connection pads 120 included in the logic semiconductor chip 100, and the plurality of fourth front connection pads 620, some of the plurality of first bridge pads 720, some of the plurality of second bridge pads 820, and some of the plurality of conductive posts 450. The plurality of the first chip connection terminals 205 may be disposed between the plurality of first front connection pads 242 included in the memory semiconductor structure 200 and others of the plurality of conductive posts 450 and others of the plurality of second bridge pads 820.

Thereafter, as shown in FIG. 4, the semiconductor package 1002 may be formed by forming the first under-fill layer 202 surrounding the plurality of first chip connection terminals 205 and filling between the memory semiconductor structure 200 and the encapsulant 400 and between the memory semiconductor structure 200 and the second bridge chip 800, and the second under-fill layer 170 surrounding the plurality of third chip connection terminals 150 and filling between the logic semiconductor chip 100 and the encapsulant 400, between the logic semiconductor chip 100 and the first bridge chip 700, and between the logic semiconductor chip 100 and the second bridge chip 800, and attaching the plurality of external connection terminals 500 to the plurality of lower connection pads 330P1.

Figure 10A:
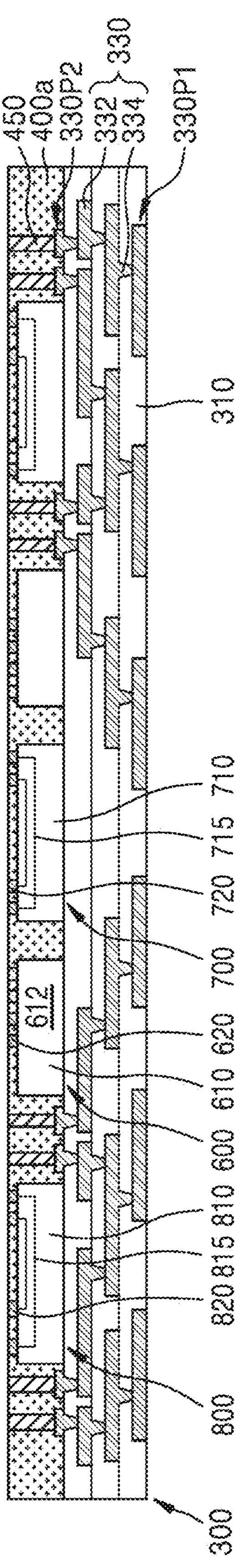
FIGS. 10A and 10B are cross-sectional views illustrating a method of manufacturing a semiconductor package according to some embodiments.
Figure 10B:
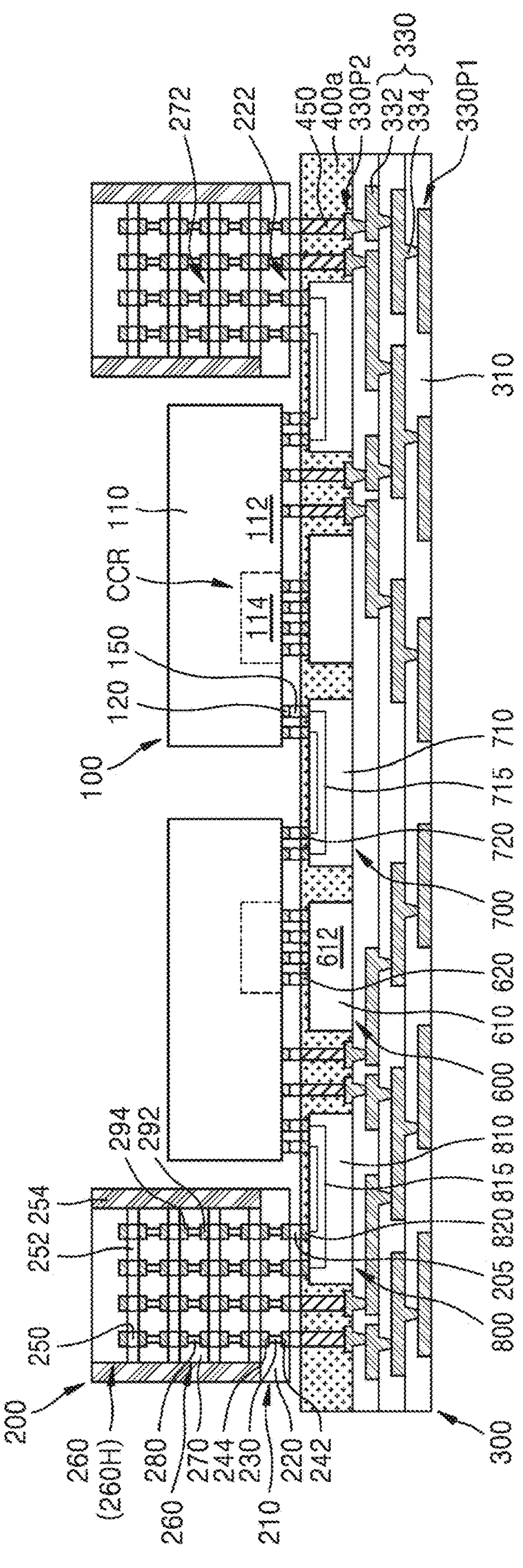

FIGS. 10A and 10B are cross-sectional views illustrating a method of manufacturing a semiconductor package according to some embodiments. Specifically, FIGS. 10A and 10B are cross-sectional views illustrating a method of manufacturing the semiconductor package 1004 shown in FIG. 5, showing operations subsequent to FIG. 8D.

Referring to FIGS. 8D and 10A together, the encapsulant 400*a* may be formed by removing an upper side of the preliminary encapsulant 400*d*. The encapsulant 400*a* may be formed by removing the upper side of the preliminary encapsulant 400*d* so that the plurality of conductive posts 450, the plurality of fourth front connection pads 620, the plurality of first bridge pads 720, and the plurality of second bridge pads 820 may not protrude from the upper surface of the encapsulant 400*a*. In some embodiments, an upper surface of each of the plurality of conductive posts 450, the plurality of fourth front connection pads 620, the plurality of first bridge pads 720, and the plurality of second bridge pads 820 and the upper surface of the encapsulant 400*a* may be positioned at the same vertical level to be coplanar.

Referring to FIG. 10B, the logic semiconductor chip 100 and the memory semiconductor structure 200 are attached onto a resultant of FIG. 10A. The plurality of third chip connection terminals 150 may be disposed between the plurality of third front connection pads 120 included in the logic semiconductor chip 100, and the plurality of fourth front connection pads 620, some of the plurality of first bridge pads 720, some of the plurality of second bridge pads 820, and some of the plurality of conductive posts 450. The plurality of the first chip connection terminals 205 may be disposed between the plurality of first front connection pads 242 included in the memory semiconductor structure 200 and others of the plurality of conductive posts 450 and others of the plurality of second bridge pads 820.

Thereafter, as shown in FIG. 5, the semiconductor package 1004 may be formed by forming the first under-fill layer 202 surrounding the plurality of first chip connection terminals 205 and filling between the memory semiconductor structure 200 and the encapsulant 400 and between the memory semiconductor structure 200 and the second bridge chip 800, and the second under-fill layer 170 surrounding the plurality of third chip connection terminals 150 and filling between the logic semiconductor chip 100 and the encapsulant 400, between the logic semiconductor chip 100 and the first bridge chip 700, and between the logic semiconductor chip 100 and the second bridge chip 800, and attaching the plurality of external connection terminals 500 to the plurality of lower connection pads 330P1.

Figure 11A:
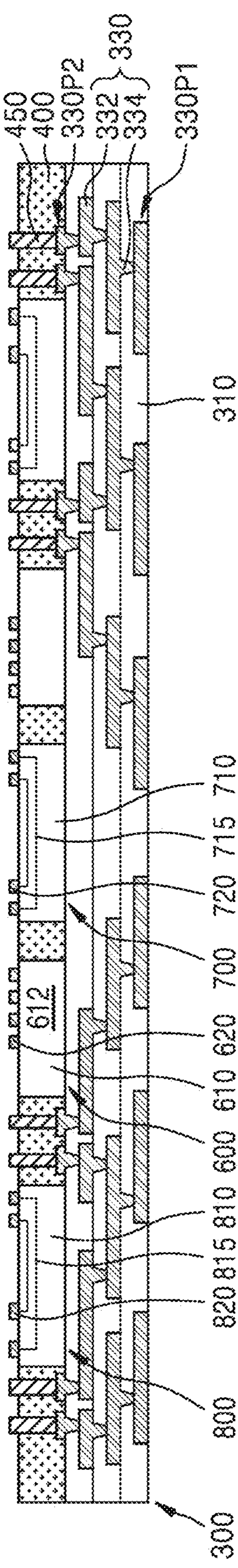
FIGS. 11A to 11C are cross-sectional views illustrating a method of manufacturing a semiconductor package according to some embodiments.
Figure 11B:
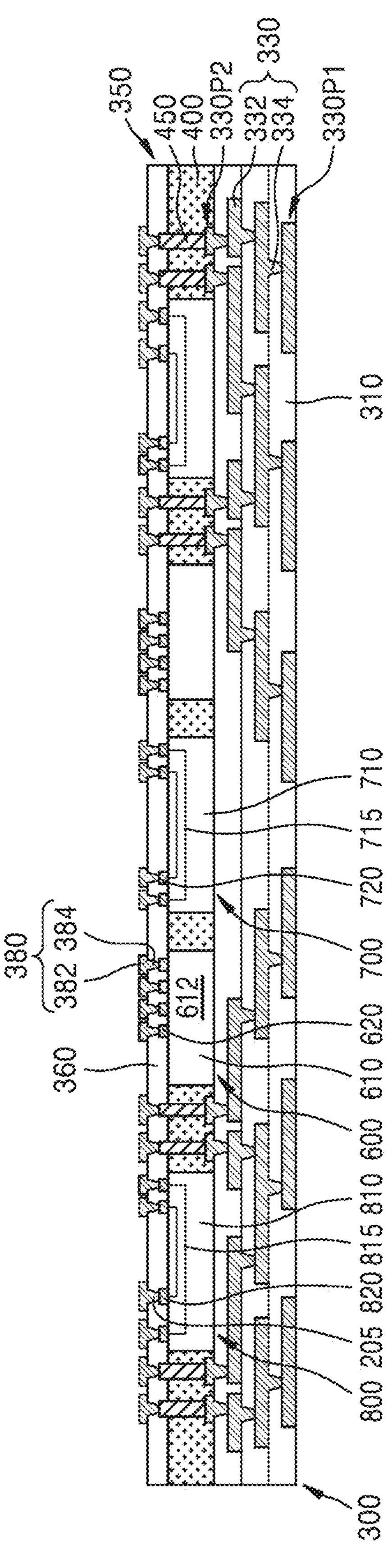
Figure 11C:
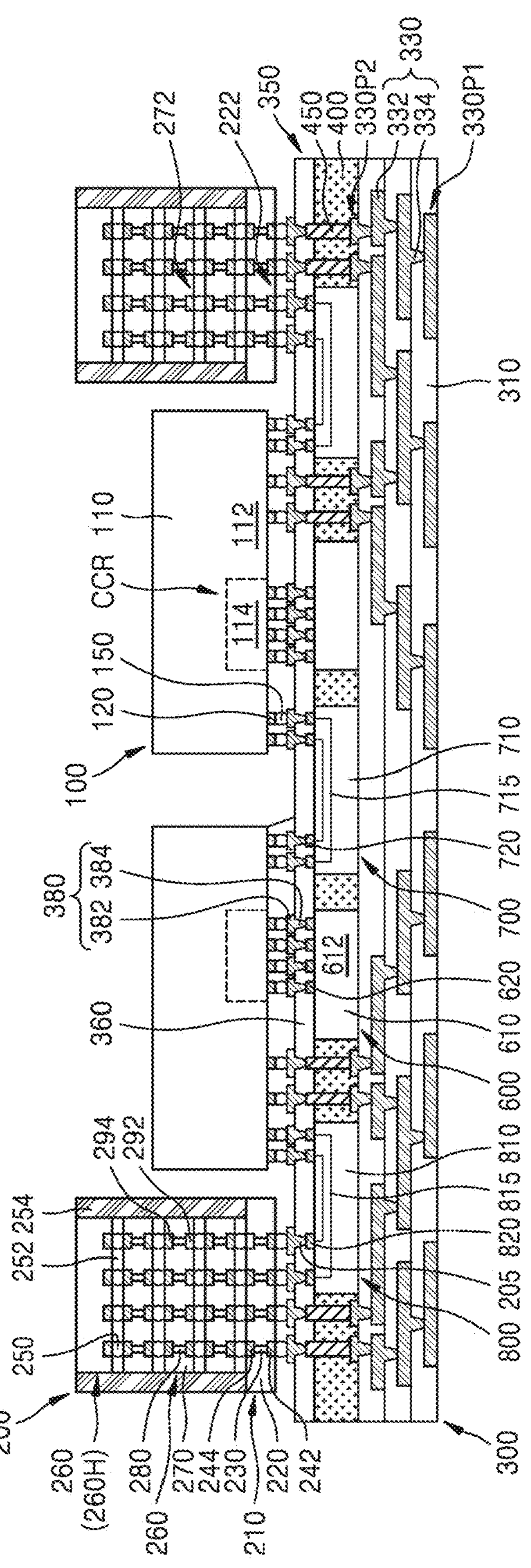

FIGS. 11A to 11C are cross-sectional views illustrating a method of manufacturing a semiconductor package according to some embodiments. Specifically, FIGS. 11A to 11C are cross-sectional views illustrating a method of manufacturing the semiconductor package 1006 shown in FIG. 6, showing operations subsequent to FIG. 8D.

Referring to 8D and 11A together, the encapsulant 400 may be formed by removing an upper side of the preliminary encapsulant 400*d*. The encapsulant 400 may be formed by removing the upper side of the preliminary encapsulant 400*d* so that upper sides of the plurality of conductive posts 450, the plurality of fourth front connection pads 620, the plurality of first bridge pads 720, and the plurality of second bridge pads 820 may protrude upward from the upper surface of the encapsulant 400.

Referring to FIG. 11B, the connection wiring structure 350 including the connection redistribution insulating layer 360, and the plurality of connection redistribution patterns 380 including the plurality of connection redistribution line patterns 382 and the plurality of connection redistribution vias 384 may be formed on a resultant of FIG. 11A.

Referring to FIG. 11C, the logic semiconductor chip 100 and the memory semiconductor structure 200 may be attached onto the connection wiring structure 350. The plurality of first chip connection terminals 205 may be respectively attached onto the plurality of first front connection pads 242 of each of the plurality of memory semiconductor structures 200, and the plurality of third chip connection terminals 150 may be respectively attached onto the plurality of third front connection pads 120 of each of the plurality of logic semiconductor chips 100.

The plurality of connection redistribution patterns 380 may be disposed between the plurality of first chip connection terminals 205 and the plurality of third chip connection terminals 150, and the plurality of fourth front connection pads 620, some of the plurality of first bridge pads 720, some of the plurality of second bridge pads 820, and some of the plurality of conductive posts 450.

Thereafter, as shown in FIG. 6, the semiconductor package 1006 may be formed by forming the first under-fill layer 202 surrounding the plurality of first chip connection terminals 205 and filling between the memory semiconductor structure 200 and the connection wiring structure 350 and he second under-fill layer 170 surrounding the plurality of third chip connection terminals 150 and filling between the logic semiconductor chip 100 and the connection wiring structure 350 and attaching the plurality of external connection terminals 500 to the plurality of lower connection pads 330P1.

Figure 12A:
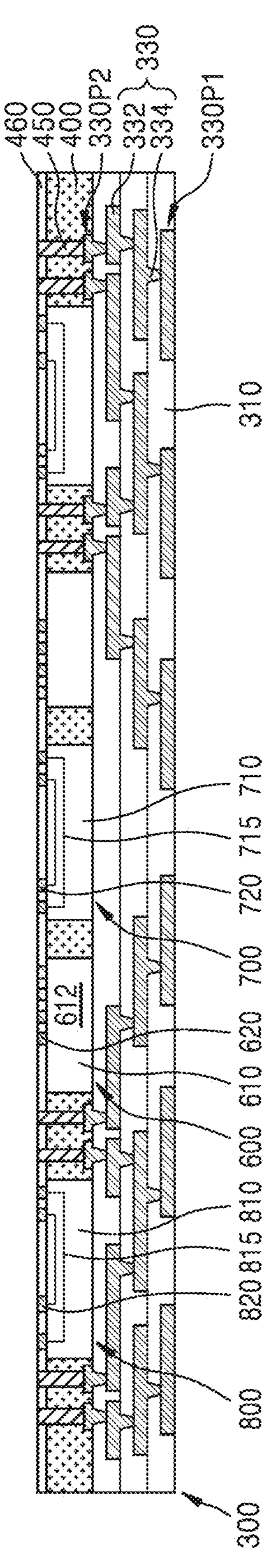
FIGS. 12A and 12B are cross-sectional views illustrating a method of manufacturing a semiconductor package according to some embodiments.
Figure 12B:
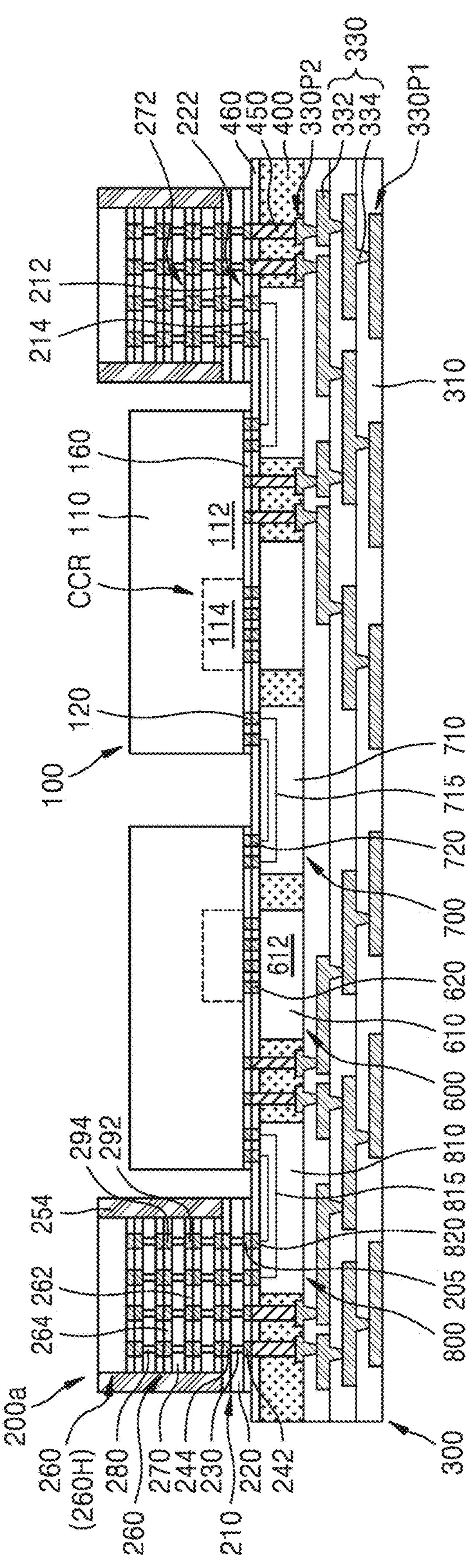

FIGS. 12A and 12B are cross-sectional views illustrating a method of manufacturing a semiconductor package according to some embodiments. Specifically, FIGS. 12A and 12B are cross-sectional views illustrating a method of manufacturing the semiconductor package 1008 shown in FIG. 7, showing operations subsequent to FIG. 8D.

Referring to FIGS. 8D and 12A together, the encapsulant 400 may be formed by removing an upper side of the preliminary encapsulant 400*d*. The encapsulant 400 may be formed by removing the upper side of the preliminary encapsulant 400*d* so that upper sides of the plurality of conductive posts 450, the plurality of fourth front connection pads 620, the plurality of first bridge pads 720, and the plurality of second bridge pads 820 may protrude upward from the upper surface of the encapsulant 400.

The pad cover insulating layer 460 surrounding the upper sides of the plurality of conductive posts 450 and side surfaces of the plurality of fourth front connection pads 620, the plurality of first bridge pads 720, and the plurality of second bridge pads 820 may be disposed on the encapsulant 400. The cover insulating layer 460 may be formed such that an upper surface of the cover insulating layer 460 may be positioned at the same vertical level as the upper surface of each of the plurality of conductive posts 450, the plurality of fourth front connection pads 620, the plurality of first bridge pads 720, and a plurality of first bridge pads 820.

Referring to FIG. 12B, the logic semiconductor chip 100 and the memory semiconductor structure 200*a* may be attached onto a resultant of FIG. 12A. Hybrid bonding may be performed in which the plurality of third front connection pads 120 included in the logic semiconductor chip 100, the plurality of fourth front connection pads 620, some of the plurality of first bridge pads 720, some of the plurality of second bridge pads 820, and some of the plurality of conductive posts 450 are in contact with each other and are combined by, and the plurality of first front connection pads 242 included in the memory semiconductor structure 200*a*, others of the plurality of conductive posts 450, and others of the plurality of second bridge pads 820 are in contact with each other and are combined by diffusion bonding so as to be integral through diffusion of metal atoms contained therein. The chip cover insulating layer 160 and the pad cover insulating layer 460 may be bonded by forming a covalent bond, and the front chip cover insulating layer 262 and the pad cover insulating layer 460 may be bonded by forming a covalent bond.

Thereafter, as shown in FIG. 7, the semiconductor package 1008 may be formed by attaching the plurality of external connection terminals 500 to the plurality of lower connection pads 330P1.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts have been particularly shown and described with reference to embodiments thereof, it will be understood that various changes in form and details may be made therein without departing from the spirit and scope of the following claims.

What is claimed is:

1. A semiconductor package comprising:
- a base wiring structure;
- a first bridge chip and a cache memory chip on the base wiring structure, the first bridge chip and the cache memory chip being spaced apart from each other in a horizontal direction; and
- a plurality of logic semiconductor chips adjacent to each other on the first bridge chip and the cache memory chip, the plurality of logic semiconductor chips each including a cache memory,
- wherein the first bridge chip overlaps at least two of the plurality of logic semiconductor chips in a vertical direction, and the first bridge chip includes a plurality of first bridge wirings electrically connecting at least two of the plurality of logic semiconductor chips, and
- wherein the cache memory chip overlaps the cache memory of at least one of the plurality of logic semiconductor chips in the vertical direction, and the cache memory chip is electrically connected by overlapping connection pads to the cache memory of at least one of the plurality of logic semiconductor chips.

2. The semiconductor package of claim 1, further comprising:

a second bridge chip on the base wiring structure, the second bridge chip being spaced apart from the first bridge chip and the cache memory chip in the horizontal direction; and a plurality of memory semiconductor structures on the second bridge chip along a perimeter of the plurality of logic semiconductor chips, wherein the second bridge chip overlaps at least one of the plurality of logic semiconductor chips in the vertical direction, the second bridge chip overlaps at least one of the plurality of memory semiconductor structures in the vertical direction, the second bridge chip includes a plurality of second bridge wirings electrically connecting at least one of the plurality of logic semiconductor chips to at least one of the plurality of memory semiconductor structures.

3. The semiconductor package of claim 2, wherein a lower surface of the cache memory chip, a lower surface of the first bridge chip, and a lower surface of the second bridge chip are at a same vertical level.

4. The semiconductor package of claim 2, further comprising:

a plurality of conductive posts on the base wiring structure, the plurality of conductive posts being spaced apart from the cache memory chip, the first bridge chip, and the second bridge chip in the horizontal direction, and the plurality of conductive posts electrically connecting the plurality of logic semiconductor chips and the plurality of memory semiconductor structures to the base wiring structure; and an encapsulant on the base wiring structure, the encapsulant surrounding the cache memory chip, the first bridge chip, the second bridge chip, and the plurality of conductive posts.

5. The semiconductor package of claim 4, wherein each of the plurality of logic semiconductor chips includes a plurality of first front connection pads, the cache memory chip includes a plurality of second front connection pads, each of the plurality of memory semiconductor structures includes a plurality of third front connection pads, the first bridge chip includes a plurality of first bridge pads connected to both ends of the plurality of first bridge wirings, the second bridge chip includes a plurality of second bridge pads connected to both ends of the plurality of second bridge wirings, and the plurality of first front connection pads of each of the plurality of logic semiconductor chips are connected to some of the plurality of first bridge pads of the first bridge chip, at least some of the plurality of second front connection pads of the cache memory chip, some of the plurality of second bridge pads of the second bridge chip, and some of the plurality of conductive posts.

6. The semiconductor package of claim 5, wherein some of the plurality of first bridge pads of the first bridge chip are connected to some of the plurality of first front connection pads of one logic semiconductor chip among the plurality of logic semiconductor chips, and others of the plurality of first bridge pads of the first bridge chip are connected to some of the plurality of first front connection pads of an other logic semiconductor chip among the plurality of logic semiconductor chips.

7. The semiconductor package of claim 5, wherein others of the plurality of second bridge pads of the second bridge chip are connected to some of the plurality of third front connection pads of each of the plurality of memory semiconductor structures.

8. The semiconductor package of claim 5, wherein a first front connection pad and a second front connection pad corresponding to each other, among the plurality of first front connection pads and the plurality of second front connection pads, are in contact with each other and form an integral structure.

9. The semiconductor package of claim 1, wherein a part of the cache memory chip protrudes outward from a footprint occupied by the plurality of logic semiconductor chips in a top-view.

10. The semiconductor package of claim 1, wherein the cache memory chip includes a plurality of cache memory chips, and the plurality of cache memory chips are symmetrically disposed on the base wiring structure in the horizontal direction with respect to the first bridge chip.

11. A semiconductor package comprising:

a base wiring structure;

a first bridge chip, a second bridge chip, and a cache memory chip on the base wiring structure and spaced apart from each other in a horizontal direction;

a plurality of logic semiconductor chips adjacent to each other on the first bridge chip and the cache memory chip, the plurality of logic semiconductor chips each including a cache memory;

a plurality of memory semiconductor structures on the second bridge chip along a perimeter of the plurality of logic semiconductor chips; and a plurality of conductive posts on the base wiring structure, the plurality of conductive posts being spaced apart from the cache memory chip, the first bridge chip, and the second bridge chip in the horizontal direction, and the plurality of conductive posts electrically connecting the plurality of logic semiconductor chips and the plurality of memory semiconductor structures to the base wiring structure, wherein the first bridge chip comprises a plurality of first bridge wirings electrically connecting at least two of the plurality of logic semiconductor chips to each other, the second bridge chip includes a plurality of second bridge wirings electrically connecting at least one of the plurality of logic semiconductor chips to at least one of the plurality of memory semiconductor structures, the cache memory chip overlaps the cache memory of at least one of the plurality of logic semiconductor chips in a vertical direction, and the cache memory chip is electrically connected by overlapping connection pads to the cache memory of at least one of the plurality of logic semiconductor chips.

12. The semiconductor package of claim 11, wherein the first bridge chip overlaps at least two of the plurality of logic semiconductor chips in the vertical direction, and the second bridge chip overlaps each of at least one of the plurality of logic semiconductor chips and at least one of the plurality of memory semiconductor structures in the vertical direction.

13. The semiconductor package of claim 11, wherein the cache memory chip includes a plurality of first front connection pads, the first bridge chip includes a plurality of first bridge pads, the second bridge chip includes a plurality of second bridge pads, some first bridge pads, of the plurality of first bridge pads, are connected to first ends of the plurality of first bridge wirings, other first bridge pads, of the plurality of the plurality of first bridge pads, are connected to second ends of the plurality of first bridge wirings, some second bridge pads, of the plurality of second bridge pads, are connected to first ends of the plurality of second bridge wirings, and other second bridge pads, of the plurality of second bridge pads, are connected to second ends of the plurality of second bridge wirings.

14. The semiconductor package of claim 13, wherein an upper surface of the plurality of first front connection pads, an upper surface of the plurality of first bridge pads, an upper surface of the plurality of second bridge pads, and an upper surface of the plurality of conductive posts are at a same vertical level.

15. The semiconductor package of claim 11, further comprising:

an encapsulant on the base wiring structure, the encapsulant surrounding the cache memory chip, the first bridge chip, the second bridge chip, and the plurality of conductive posts; and a connection wiring structure between the plurality of logic semiconductor chips and the plurality of memory semiconductor structures and the encapsulant, the connection wiring structure including a plurality of connection redistribution patterns and a connection redistribution insulating layer surrounding the plurality of connection redistribution patterns, wherein the first bridge chip and the plurality of logic semiconductor chips, the second bridge chip and the plurality of logic semiconductor chips, and the plurality of memory semiconductor structures, the cache memory chip and the cache memory are electrically connected to each other through the plurality of connection redistribution patterns.

16. The semiconductor package of claim 11, wherein the cache memory and the cache memory chip are respectively an L2 cache and an L3 cache of the plurality of logic semiconductor chips.

17. The semiconductor package of claim 11, wherein each of the plurality of memory semiconductor structures includes a first semiconductor chip on the second bridge chip, a plurality of second semiconductor chips sequentially stacked on the first semiconductor chip in the vertical direction, and a chip molding layer surrounding side surfaces of the plurality of second semiconductor chips on the first semiconductor chip.

18. A semiconductor package comprising:

a base wiring structure;

a first bridge chip, a second bridge chip, and a plurality of cache memory chips on the base wiring structure and spaced apart from each other in a horizontal direction, a lower surface of the first bridge chip, a lower surface of the second bridge chip, and lower surfaces of the plurality of cache memory chips being at a same vertical level;

four logic semiconductor chips disposed adjacent to each other on the first bridge chip and the plurality of cache memory chips, the four logic semiconductor chips each having a cache memory;

a plurality of memory semiconductor structures on the second bridge chip along a perimeter of the four logic semiconductor chips;

a plurality of conductive posts on the base wiring structure, the plurality of conductive posts being spaced apart from the cache memory chip, the first bridge chip, and the second bridge chip in the horizontal direction, and the plurality of conductive posts electrically connecting the four logic semiconductor chips and the plurality of memory semiconductor structures to the base wiring structure; and an encapsulant on the base wiring structure, the encapsulant surrounding the cache memory chip, the first bridge chip, the second bridge chip, and the plurality of conductive posts, wherein the first bridge chip overlaps at least two of the four logic semiconductor chips in a vertical direction, and the first bridge chip includes a plurality of first bridge wirings electrically connecting at least two of the four logic semiconductor chips, the second bridge chip overlaps at least one of the four logic semiconductor chips in the vertical direction and the second bridge chip overlaps at least one of the plurality of memory semiconductor structures in the vertical direction, the second bridge chip includes a plurality of second bridge wirings electrically connecting at least one of the four logic semiconductor chips to at least one of the plurality of memory semiconductor structures, each of the plurality of cache memory chips overlaps the cache memory of at least one of the four logic semiconductor chips in the vertical direction, and each of the plurality of cache memory chips is electrically connected by overlapping connection pads to the cache memory of at least one of the four logic semiconductor chips.

19. The semiconductor package of claim 18, wherein each of the plurality of memory semiconductor structures includes a high bandwidth dynamic random-access memory (HBM DRAM) including a buffer chip on the encapsulant and the second bridge chip, a plurality of memory cell chips sequentially stacked on the buffer chip in a vertical direction, and a chip molding layer surrounding side surfaces of the plurality of memory cell chips on the buffer chip.

20. The semiconductor package of claim 18, wherein some of the plurality of cache memory chips are on one side of the first bridge chip, others of the plurality of cache memory chips are on an other side of the first bridge chip, the one side of the first bridge chip and the other side of the first bridge chip are opposite sides of the first bridge chip, and the plurality of cache memory chips are symmetrically disposed with respect to the first bridge chip in a top-view.

* * * * *